US010405426B2

(12) United States Patent
Adachi et al.

(10) Patent No.: US 10,405,426 B2
(45) Date of Patent: Sep. 3, 2019

(54) PRINTED WIRING BOARD

(71) Applicant: IBIDEN CO., LTD., Ogaki (JP)

(72) Inventors: Takema Adachi, Ogaki (JP); Toshihide Makino, Ogaki (JP); Hidetoshi Noguchi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 16/169,340

(22) Filed: Oct. 24, 2018

(65) Prior Publication Data

US 2019/0124767 A1 Apr. 25, 2019

(30) Foreign Application Priority Data

Oct. 24, 2017 (JP) .................................. 2017-204927

(51) Int. Cl.
| | |
|---|---|
| *H05K 1/11* | (2006.01) |
| *H05K 3/46* | (2006.01) |
| *H05K 1/03* | (2006.01) |
| *H05K 3/06* | (2006.01) |
| *H05K 3/42* | (2006.01) |

(52) U.S. Cl.
CPC .......... *H05K 1/115* (2013.01); *H05K 1/0373* (2013.01); *H05K 3/06* (2013.01); *H05K 3/422* (2013.01); *H05K 3/4652* (2013.01); *H05K 2201/096* (2013.01); *H05K 2201/09563* (2013.01); *H05K 2201/09827* (2013.01); *H05K 2203/072* (2013.01); *H05K 2203/107* (2013.01)

(58) Field of Classification Search
CPC ...... H05K 1/115; H05K 3/4644; H05K 3/429; H05K 2203/0723; H05K 2201/09827; H05K 2203/107

USPC ........................................................ 174/264
See application file for complete search history.

(56) References Cited

U.S. PATENT DOCUMENTS

2009/0242261 A1* 10/2009 Takenaka ............. H05K 1/0271
174/262
2013/0256007 A1* 10/2013 Furutani ................ H05K 1/185
174/255
(Continued)

FOREIGN PATENT DOCUMENTS

JP 2012-156525 A 8/2012

*Primary Examiner* — Sherman Ng
(74) *Attorney, Agent, or Firm* — Oblon, McClelland, Maier & Neustadt, L.L.P.

(57) ABSTRACT

A printed wiring board includes: a core substrate having a core layer, first and second conductor layers, and through-hole conductors penetrating through the core layer and connecting the conductor layers; and first and second build-up layers each including an insulating layer, an inner side conductor layer, an outermost insulating layer, an outermost conductor layer, and a solder resist layer. Each of the conductor layers includes conductor circuits having substantially a trapezoid cross-sectional shape, and spaces between adjacent conductor circuits, and includes a metal foil, a seed layer, and an electrolytic plating film. The inner side conductor layers have the smallest minimum circuit width, the smallest minimum space width and the largest base angle among the conductor layers. The insulating layers have the smallest ten-point average roughness rz3, rz7 among the ten-point average roughness rz3, rz7, rz1, rz2, rz5 and rz9 of the core layer, insulating layers and outermost insulating layers.

20 Claims, 9 Drawing Sheets

(56) References Cited

U.S. PATENT DOCUMENTS

| | | | |
|---|---|---|---|
| 2014/0027165 A1* | 1/2014 | Morita | H05K 1/0306 174/258 |
| 2014/0083746 A1* | 3/2014 | Watanabe | H01L 23/49827 174/251 |
| 2015/0271923 A1* | 9/2015 | Shimabe | H05K 1/185 174/251 |
| 2016/0133555 A1* | 5/2016 | Nakamura | H01L 23/49822 257/774 |

* cited by examiner

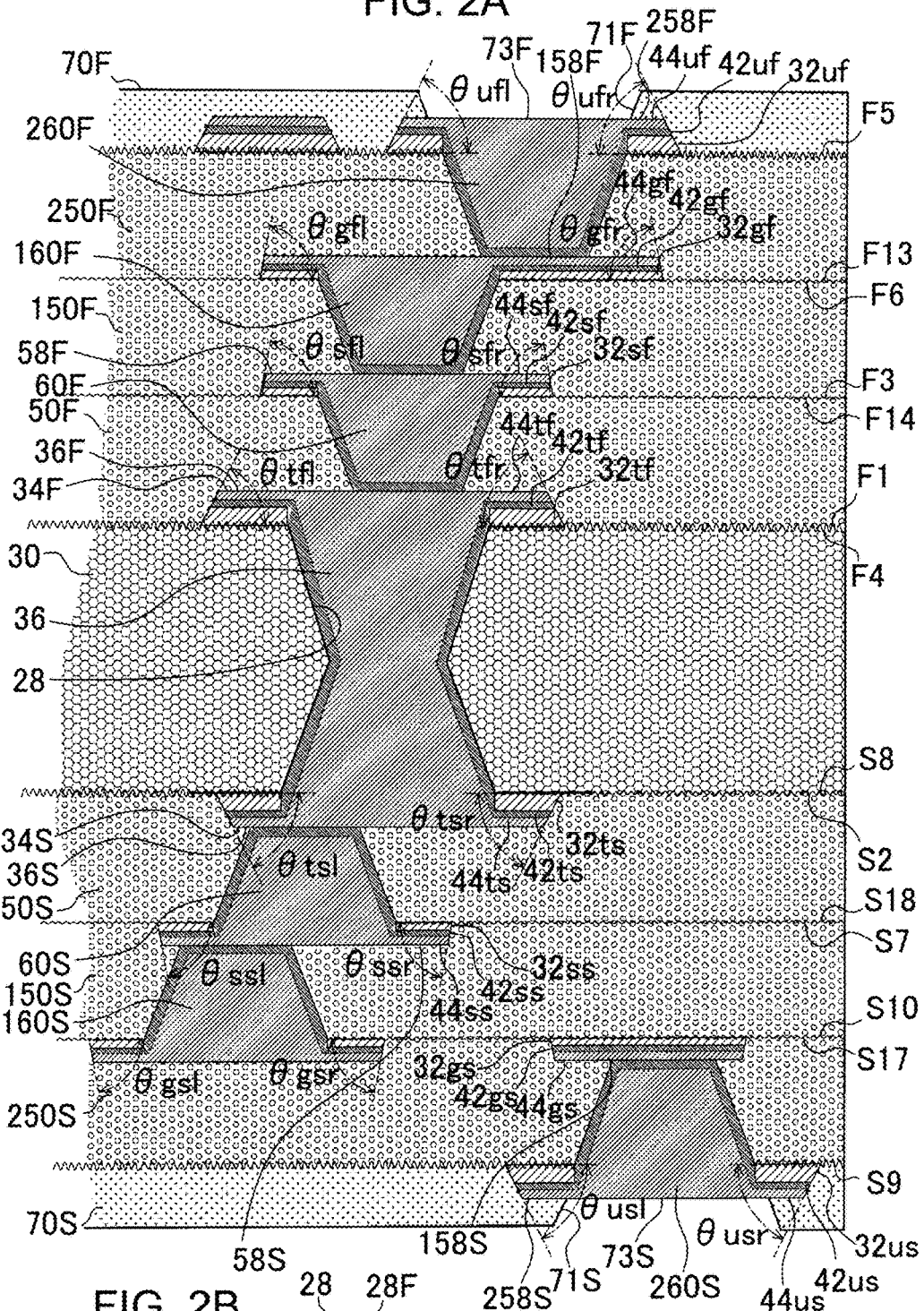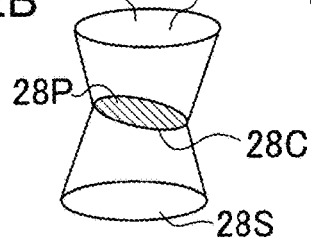

PRINTED WIRING BOARD

CROSS-REFERENCE TO RELATED APPLICATIONS

The present application is based upon and claims the benefit of priority to Japanese Patent Application No. 2017-204927, filed Oct. 24, 2017, the entire contents of which are incorporated herein by reference.

BACKGROUND OF THE INVENTION

Field of the Invention

The present invention relates to a printed wiring board having a core substrate and conductor layers and resin insulating layers that are alternately laminated on the core substrate.

Description of Background Art

Japanese Patent Laid-Open Publication No. 2012-156525 describes a multilayer printed wiring board and a method for manufacturing the multilayer printed wiring board. In the printed wiring board, insulating layers and conductor layers are alternately laminated, and adjacent conductor layers are connected to each other by via holes formed in the insulating layers. The entire contents of this publication are incorporated herein by reference.

SUMMARY OF THE INVENTION

According to one aspect of the present invention, a printed wiring board includes: a core substrate having a core layer, a first conductor layer on a first surface of the core layer, a second conductor layer on a second surface of the core layer on the opposite side with respect to the first surface, and through-hole conductors penetrating through the core layer and connecting the first conductor layer and the second conductor layer; a first build-up layer formed on a first surface side of the core substrate and including a first resin insulating layer, an inner side first conductor layer formed on the first resin insulating layer, an outermost first resin insulating layer formed on the inner side first conductor layer, an outermost first conductor layer formed on the outermost first resin insulating layer, and a first solder resist layer formed on the outermost first conductor layer; and a second build-up layer formed on a second surface side of the core substrate on the opposite side with respect to the first surface side and including a second resin insulating layer, an inner side second conductor layer formed on the second resin insulating layer, an outermost second resin insulating layer formed on the inner side second conductor layer, an outermost second conductor layer formed on the outermost second resin insulating layer, and a second solder resist layer formed on the outermost second conductor layer. Each of the first and second conductor layers, inner side first and second conductor layers and outermost first and second conductor layers includes conductor circuits having substantially a trapezoid cross-sectional shape, and spaces between adjacent conductor circuits. Each of the first and second conductor layers, inner side first and second conductor layers and outermost first and second conductor layers includes a metal foil, a seed layer formed on the metal foil, and an electrolytic plating film formed on the seed layer. The inner side first conductor layer has the smallest minimum circuit width, the smallest minimum space width and the largest base angle among the inner side first conductor layer, first and second conductor layers and outermost first and second conductor layers. The inner side second conductor layer has the smallest minimum circuit width, the smallest minimum space width and the largest base angle among the inner side second conductor layer, first and second conductor layers and outermost first and second conductor layers. The core layer, first and second resin insulating layers and outermost first and second resin insulating layers are formed such that $rz3$ is the smallest among $rz3$, $rz1$, $rz2$, $rz5$ and $rz9$ and that $rz7$ is the smallest among $rz7$, $rz1$, $rz2$, $rz5$, and $rz9$, where $rz1$ is a ten-point average roughness of the first surface of the core layer, $rz2$ is a ten-point average roughness of the second surface of the core layer, $rz3$ is a ten-point average roughness of a surface of the first resin insulating layer facing the inner side first conductor layer, $rz5$ is a ten-point average roughness of a surface of the second resin insulating layer facing the inner side second conductor layer, $rz7$ is a ten-point average roughness of a surface of the outermost first resin insulating layer facing the outermost first conductor layer, and $rz9$ is a ten-point average roughness of a surface of the outermost second resin insulating layer facing the outermost second conductor layer.

According to another aspect of the present invention, a printed wiring board includes: a core substrate having a core layer, a first conductor layer on a first surface of the core layer, a second conductor layer on a second surface of the core layer on the opposite side with respect to the first surface, and through-hole conductors penetrating through the core layer and connecting the first conductor layer and the second conductor layer; a first build-up layer formed on a first surface side of the core substrate and including a first resin insulating layer, an inner side first conductor layer formed on the first resin insulating layer, an outermost first resin insulating layer formed on the inner side first conductor layer, and an outermost first conductor layer formed on the outermost first resin insulating layer; and a second build-up layer formed on a second surface side of the core substrate on the opposite side with respect to the first surface side of the core substrate and including a second resin insulating layer, an inner side second conductor layer formed on the second resin insulating layer, an outermost second resin insulating layer formed on the inner side second conductor layer, and an outermost second conductor layer formed on the outermost second resin insulating layer. Each of the first and second conductor layers, inner side first and second conductor layers and outermost first and second conductor layers includes conductor circuits having substantially a trapezoid cross-sectional shape and a base angle. The core layer, first and second resin insulating layers and outermost first and second resin insulating layers are formed such that the first surface of the core layer has a ten-point average roughness $rz1$, the second surface of the core layer has a ten-point average roughness $rz2$, a surface of the first resin insulating layer facing the inner side first conductor layer has a ten-point average roughness $rz3$, a surface of the second resin insulating layer facing the inner side second conductor layer has a ten-point average roughness $rz5$, a surface of the outermost first resin insulating layer facing the outermost first conductor layer has a ten-point average roughness $rz7$, and a surface of the outermost second resin insulating layer facing the outermost second conductor layer has a ten-point average roughness $rz9$. The first and second conductor layers, inner side first and second conductor layers and outermost first and second conductor layers are formed such that when a resin insulating layer has a larger ten-point average roughness, a base angle of the trapezoid cross-sectional shape on the resin insulating layer is formed smaller, and that when a resin insulating layer has a smaller ten-point average roughness, a base angle of the trapezoid cross-sectional shape is formed larger.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2A is an enlarged view of the printed wiring board of the embodiment;

FIG. 2B is an explanatory diagram of a through hole for a through-hole conductor;

DETAILED DESCRIPTION OF THE EMBODIMENTS

Figure 1A:
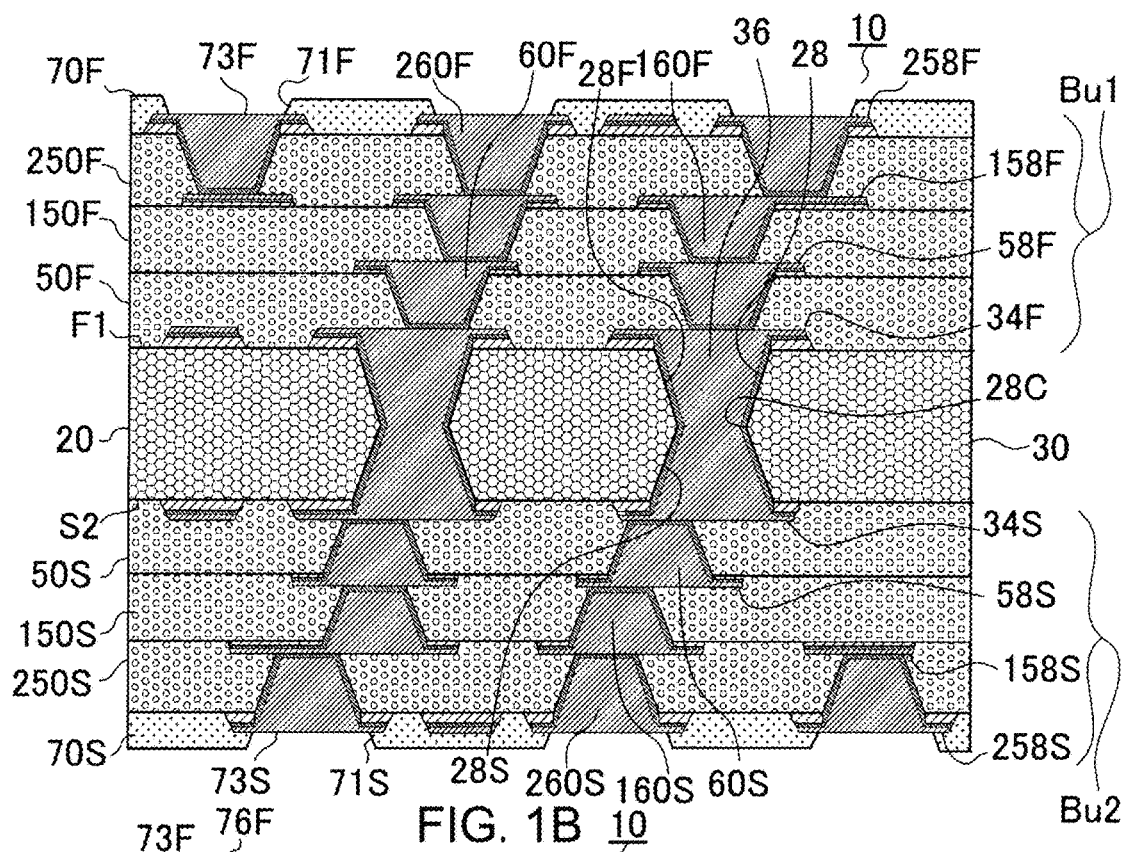
FIGS. 1A and 1B respectively illustrate cross-sectional views of a printed wiring board and a printed wiring board having solder bumps according to an embodiment of the present invention.

Embodiments will now be described with reference to the accompanying drawings, wherein like reference numerals designate corresponding or identical elements throughout the various drawings.

Embodiment

FIG. 1A is a cross-sectional view of a printed wiring board according to an embodiment.

The printed wiring board 10 has a core substrate 30 that has a first surface (F1) and a second surface (S2) on an opposite side with respect to the first surface (F1). The core substrate 30 is formed by a core layer 20 that has a first surface (F1) and a second surface (S2) on an opposite side with respect to the first surface (F1), a first conductor layer (34F) formed on the first surface (F1) of the core layer 20, a second conductor layer (34S) formed on the second surface (S2) of the core layer 20, and through-hole conductors 36 that penetrate the core layer 20 and connect the first conductor layer (34F) and the second conductor layer (34S) to each other. The core layer 20 is formed of a resin, a reinforcing material, and inorganic particles. An example of the resin is an epoxy resin, an example of the reinforcing material is a glass cloth, and an example of inorganic particles is silica particles. The core layer 20 has through holes 28 that are each formed from a first opening (28F) tapering from the first surface (F1) toward the second surface (S2) and a second opening (28S) tapering from the second surface (S2) toward the first surface (F1). The through-hole conductors 36 are formed by filling the through holes 28 with plating. The first surface (F1) of the core substrate 30 and the first surface (F1) of the core layer 20 are the same surface, and the second surface (S2) of the core substrate 30 and the second surface (S2) of the core layer 20 are the same surface.

The printed wiring board further has a first build-up layer (Bu1) on the first surface (F1) of the core substrate 30. The first build-up layer (Bu1) includes a first resin insulating layer (50F) formed on the first surface (F1) of the core substrate 30 and on the first conductor layer (34F), an inner side first conductor layer (58F) formed on the first resin insulating layer (50F), first via conductors (60F) penetrating the first resin insulating layer (50F) and connecting the first conductor layer (34F) and the inner side first conductor layer (58F) to each other, a third resin insulating layer (150F) formed on the first resin insulating layer (50F) and on the inner side first conductor layer (58F), an inner side third conductor layer (158F) formed on the third resin insulating layer (150F), third via conductors (160F) penetrating the third resin insulating layer (150F) and connecting the inner side first conductor layer (58F) and the inner side third conductor layer (158F) to each other, an outermost first resin insulating layer (250F) formed on the third resin insulating layer (150F) and on the inner side third conductor layer (158F), an outermost first conductor layer (258F) formed on the outermost first resin insulating layer (250F), and outermost first via conductors (260F) penetrating the outermost first resin insulating layer (250F) and connecting the inner side third conductor layer (158F) and the outermost first conductor layer (258F) to each other.

The resin insulating layers in the first build-up layer (Bu1) are classified into an outermost resin insulating layer and inner side resin insulating layers. The inner side resin insulating layers are formed between the outermost resin insulating layer and the core layer 20. In the printed wiring board 10 of FIG. 1A, the first resin insulating layer (50F) and the third resin insulating layer (150F) belong to the inner side resin insulating layers, and the outermost first resin insulating layer (250F) belongs to the outermost resin insulating layer.

The conductor layers in the first build-up layer (Bu1) are classified into an outermost conductor layer and inner side conductor layers. The inner side conductor layers are respectively formed on the inner side resin insulating layers. In the printed wiring board 10 of FIG. 1A, the inner side first conductor layer (58F) and the inner side third conductor layer (158F) belong to the inner side conductor layers, and the outermost first conductor layer (258F) belongs to the outermost conductor layer.

The printed wiring board has a second build-up layer (Bu2) on the second surface (S2) of the core substrate 30. The second build-up layer (Bu2) includes a second resin insulating layer (50S) formed on the second surface (S2) of the core substrate 30 and on the second conductor layer (34S), an inner side second conductor layer (58S) formed on the second resin insulating layer (50S), second via conductors (60S) penetrating the second resin insulating layer (50S) and connecting the second conductor layer (34S) and the inner side second conductor layer (58S) to each other, a fourth resin insulating layer (150S) formed on the second resin insulating layer (50S) and on the inner side second conductor layer (58S), an inner side fourth conductor layer (158S) formed on the fourth resin insulating layer (150S), fourth via conductors (160S) penetrating the fourth resin insulating layer (150S) and connecting the inner side second conductor layer (58S) and the inner side fourth conductor layer (158S) to each other, an outermost second resin insulating layer (250S) formed on the fourth resin insulating layer (150S) and on the inner side fourth conductor layer (158S), an outermost second conductor layer (258S) formed on the outermost second resin insulating layer (250S), and outermost second via conductors (260S) penetrating the outermost second resin insulating layer (250S) and connecting the inner side fourth conductor layer (158S) and the outermost second conductor layer (258S) to each other.

The resin insulating layers in the second build-up layer are classified into an outermost resin insulating layer and inner side resin insulating layers. The inner side resin insulating layers are formed between the outermost resin insulating layer and the core layer 20. In the printed wiring board 10 of FIG. 1A, the second resin insulating layer (50S) and the fourth resin insulating layer (150S) belong to the inner side resin insulating layers, and the outermost second resin insulating layer (250S) belongs to the outermost resin insulating layer.

The conductor layers in the second build-up layer (Bu2) are classified into an outermost conductor layer and inner side conductor layers. The inner side conductor layers are respectively formed on the inner side resin insulating layers. In the printed wiring board 10 of FIG. 1A, the inner side second conductor layer (58S) and the inner side fourth conductor layer (158S) belong to the inner side conductor layers, and the outermost second conductor layer (258S) belongs to the outermost conductor layer.

The resin insulating layers belonging to the first build-up layer (Bu1) and the second build-up layer (Bu2) are each formed of a resin, a reinforcing material, and inorganic particles. Examples of these materials are the same as the examples of the materials for the core layer.

A first solder resist layer (70F) having first openings (71F) is formed on the first build-up layer (Bu1). The outermost first conductor layer (258F) exposed from the first openings (71F) forms first pads (73F) for mounting an electronic component.

A second solder resist layer (70S) having second openings (71S) is formed on the second build-up layer (Bu2). The outermost second conductor layer (258S) exposed from the second openings (71S) forms second pads (73S) for mounting an electronic component.

Figure 3A:
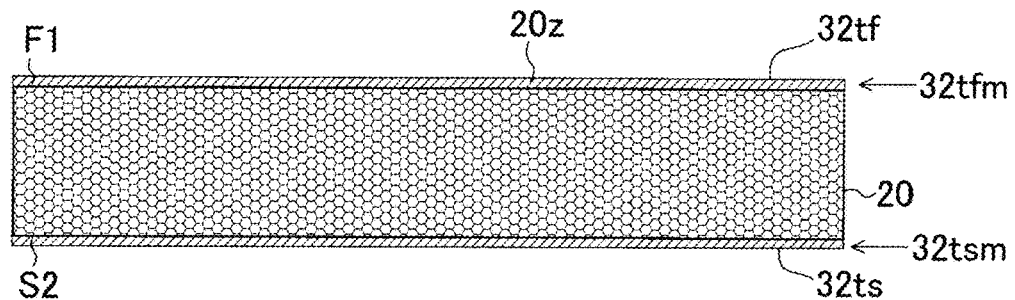
FIG. 3A-3D are manufacturing process diagrams of the printed wiring board of the embodiment.
Figure 3B:
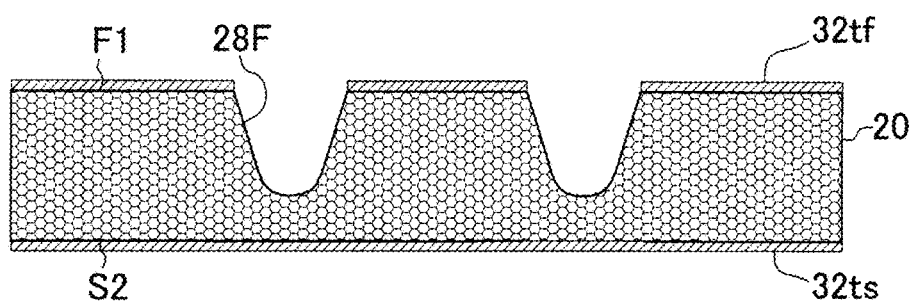
Figure 3C:
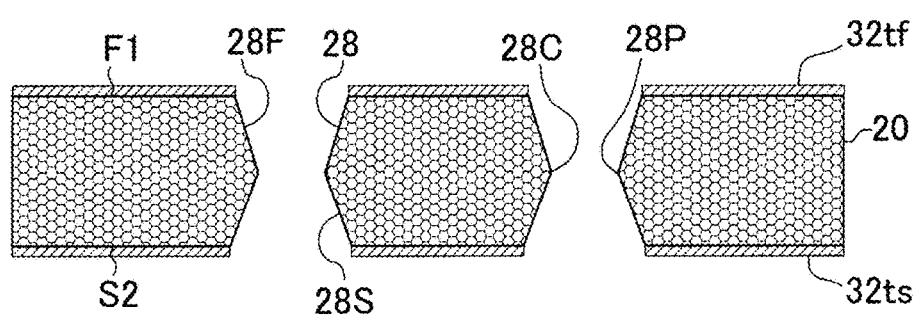

As illustrated in FIG. 3C, the through holes 28 are each formed by the first opening (28F) and the second opening (28S). As illustrated in FIG. 2B, the first opening (28F) and the second opening (28S) are connected to each other at a joining area (28P). In FIG. 2B, oblique lines are drawn in the joining area (28P). An outer periphery of the joining area (28P) is referred to as a neck part (28C). The through-hole conductors 36 of the embodiment are respectively formed in such through holes 28. Therefore, the through-hole conductors 36 bend at the neck parts (28C). Therefore, when the through-hole conductors 36 of the embodiment are subjected to a stress, connection reliability is likely to decrease. However, from a point of view of thicknesses of the conductor layers, the through-hole conductors 36 of the embodiment are unlikely to deteriorate.

The first conductor layer (34F) has first through-hole lands (36F) that are respectively directly connected to the through-hole conductors 36. The first through-hole lands (36F) are respectively positioned directly on the through-hole conductors 36 and respectively extend from the through-hole conductors 36.

The second conductor layer (34S) has second through-hole lands (36S) that are respectively directly connected to the through-hole conductors 36. The second through-hole lands (36S) are respectively positioned directly on the through-hole conductors 36 and respectively extend from the through-hole conductors 36.

FIG. 2A is an enlarged view of the printed wiring board illustrated in FIG. 1A. The first conductor layer (34F) includes a first metal foil ($32tf$) formed on the first surface (F1) of the core layer 20, a first seed layer ($42tf$) formed on the first metal foil ($32tf$), and a first electrolytic plating film ($44tf$) formed on the first seed layer ($42tf$).

The second conductor layer (34S) includes a second metal foil ($32ts$) formed on the second surface (S2) of the core layer 20, a second seed layer ($42ts$) formed on the second metal foil (ts), and a second electrolytic plating film ($44ts$) formed on the second seed layer ($42ts$).

The inner side first conductor layer (58F) includes an inner side first metal foil ($32sf$) formed on the first resin insulating layer (50F), an inner side first seed layer ($42sf$) formed on the inner side first metal foil ($32sf$), and an inner side first electrolytic plating film ($44sf$) formed on the inner side first seed layer ($42sf$).

The inner side second conductor layer (58S) includes an inner side second metal foil ($32ss$) formed on the second resin insulating layer (50S), an inner side second seed layer ($42ss$) formed on the inner side second metal foil ($32ss$), and an inner side second electrolytic plating film ($44ss$) formed on the inner side second seed layer ($42ss$).

The inner side third conductor layer (158F) includes an inner side third metal foil ($32gf$) formed on the third resin insulating layer (150F), an inner side third seed layer ($42gf$) formed on the inner side third metal foil ($32gf$), and an inner side third electrolytic plating film ($44gf$) formed on the inner side third seed layer ($42gf$).

The inner side fourth conductor layer (158S) includes an inner side fourth metal foil ($32gs$) formed on the fourth resin insulating layer (150S), an inner side fourth seed layer ($42gs$) formed on the inner side fourth metal foil ($32gs$), and an inner side fourth electrolytic plating film ($44gs$) formed on the inner side fourth seed layer ($42gs$).

The outermost first conductor layer (258F) includes an outermost first metal foil ($32uf$) formed on the outermost first resin insulating layer (250F), an outermost first seed layer ($42uf$) formed on the outermost first metal foil ($32uf$), and an outermost first electrolytic plating film ($44uf$) formed on the outermost first seed layer ($42uf$).

The outermost second conductor layer (258S) includes an outermost second metal foil ($32us$) formed on the outermost second resin insulating layer (250S), an outermost second seed layer ($42us$) formed on the outermost second metal foil ($32us$), and an outermost second electrolytic plating film ($44us$) formed on the outermost second seed layer ($42us$).

The first resin insulating layer (50F) formed on the first surface (F1) of the core substrate 30 has a fourth surface (F4) opposing the first surface (F1) and a third surface (F3) on an opposite side with respect to the fourth surface (F4). The second resin insulating layer (505) formed on the second surface (S2) of the core substrate 30 has an eighth surface (S8) opposing the second surface (S2) and a seventh surface (S7) on an opposite side with respect to the eighth surface (S8). The third resin insulating layer (150F) formed on the third surface (F3) of the first resin insulating layer (50F) has a fourteenth surface (F14) opposing the third surface (F3) and a thirteenth surface (F13) on an opposite side with respect to the fourteenth surface (F14). The fourth resin insulating layer (150S) formed on the seventh surface (S7)

of the second resin insulating layer (50S) has an eighteenth surface (S18) opposing the seventh surface (S7) and a seventeenth surface (S17) on an opposite side with respect to the eighteenth surface (S18). The outermost first resin insulating layer (250F) formed on the thirteenth surface (F13) of the third resin insulating layer (150F) has a sixth surface (F6) opposing the thirteenth surface (F13) and a fifth surface (F5) on an opposite side with respect to the sixth surface (F6). The outermost second resin insulating layer (250S) formed on the seventeenth surface (S17) of the fourth resin insulating layer (150S) has a tenth surface (510) opposing the seventeenth surface (S17) and a ninth surface (S9) on an opposite side with respect to the tenth surface (S10).

The first surface (F1) of the core layer 20, the second surface (S2) of the core layer 20, the third surface (F3) of the first resin insulating layer (50F), the thirteenth surface (F13) of the third resin insulating layer (150F), the fifth surface (F5) of the outermost first resin insulating layer (250F), the seventh surface (S7) of the second resin insulating layer (50S), the seventeenth surface (S17) of the fourth resin insulating layer (150S), and the ninth surface (S9) of the outermost second resin insulating layer (250S) each have a rough surface. The rough surface of the first surface (F1) has a first ten-point average roughness (rz1). The rough surface of the second surface (S2) has a second ten-point average roughness (rz2). The rough surface of the third surface (F3) has a third ten-point average roughness (rz3). The rough surface of the fifth surface (F5) has a fifth ten-point average roughness (rz5). The rough surface of the seventh surface (S7) has a seventh ten-point average roughness (rz7). The rough surface of the ninth surface (S9) has a ninth ten-point average roughness (rz9). The rough surface of the thirteenth surface (F13) has a thirteenth ten-point average roughness (rz13). The rough surface of the seventeenth surface (S17) has a seventeenth ten-point average roughness (rz17). In this specification, a ten-point average roughness can be referred to as a roughness.

The sizes (the roughness (rz1) and the roughness (rz2)) of the rough surfaces (the rough surface of the first surface (F1) and the rough surface of the second surface (S2)) of the core layer 20 and the sizes (the roughness (rz5) and the roughness (rz9)) of the rough surfaces (the rough surface of the fifth surface (F5) and the rough surface of the ninth surface (S9)) of the outermost resin insulating layers (the outermost first resin insulating layer (250F) and the outermost second resin insulating layer (250S)) are substantially equal to each other. The roughness (rz1), the roughness (rz2), the roughness (rz5) and the roughness (rz9) are substantially equal to each other.

The first build-up layer (Bu1) has multiple inner side resin insulating layers. In this case, among the inner side resin insulating layers in the first build-up layer (Bu1), the size of the rough surface of at least one inner side resin insulating layer is smaller than the roughness (rz5) of the rough surface of the fifth surface (F5). In this case, the at least one inner side resin insulating layer is a resin insulating layer having a small rough surface, and the outermost first resin insulating layer (250F) is a resin insulating layer having a large rough surface. In this way, the printed wiring board 10 of the embodiment has one or more resin insulating layers each having a small rough surface and one or more resin insulating layers each having a large rough surface.

When the first build-up layer (Bu1) has multiple inner side resin insulating layers, at least one inner side resin insulating layer is a resin insulating layer having a small rough surface, and at least one inner side resin insulating layer is a resin insulating layer having a large rough surface.

When the first build-up layer (Bu1) has 3 or more inner side resin insulating layers, ⅔ or more of the inner side resin insulating layers are resin insulating layers each having a small rough surface.

The second build-up layer (Bu2) has multiple inner side resin insulating layers. In this case, among the inner side resin insulating layers in the second build-up layer (Bu2), the size of the rough surface of at least one inner side resin insulating layer is smaller than the roughness (rz9) of the rough surface of the ninth surface (S9). In this case, the at least one inner side resin insulating layer is a resin insulating layer having a small rough surface, and the outermost second resin insulating layer (250S) is a resin insulating layer having a large rough surface. In this way, the printed wiring board 10 of the embodiment has one or more resin insulating layers each having a small rough surface and one or more resin insulating layers each having a large rough surface.

When the second build-up layer (Bu2) has multiple inner side resin insulating layers, at least one inner side resin insulating layer is a resin insulating layer having a small rough surface, and at least one inner side resin insulating layer is a resin insulating layer having a large rough surface.

When the second build-up layer (Bu2) has 3 or more inner side resin insulating layers, ⅔ or more of the inner side resin insulating layers are resin insulating layers each having a small rough surface.

The resin insulating layers are classified into resin insulating layers each having a small rough surface and resin insulating layers each having a large rough surface. When the size of the rough surface of a resin insulating layer having a small rough surface and the roughness of the rough surface of a resin insulating layer having a large rough surface are compared to each other, the size of the rough surface of the resin insulating layer having a small rough surface is smaller than the size of the rough surface of the resin insulating layer having a large rough surface. A resin insulating layer having a small rough surface is a resin insulating layer having a relatively small rough surface. A resin insulating layer having a large rough surface is a resin insulating layer having a relatively large rough surface.

The sizes of the rough surfaces of the resin insulating layers each having a small rough surface are substantially equal to each other. The sizes of the rough surfaces of the resin insulating layers each having a large rough surface are substantially equal to each other. The size of a small rough surface is smaller than the size of a large rough surface.

The roughness (size) of a rough surface is represented by a ten-point average roughness.

Figure 9A:
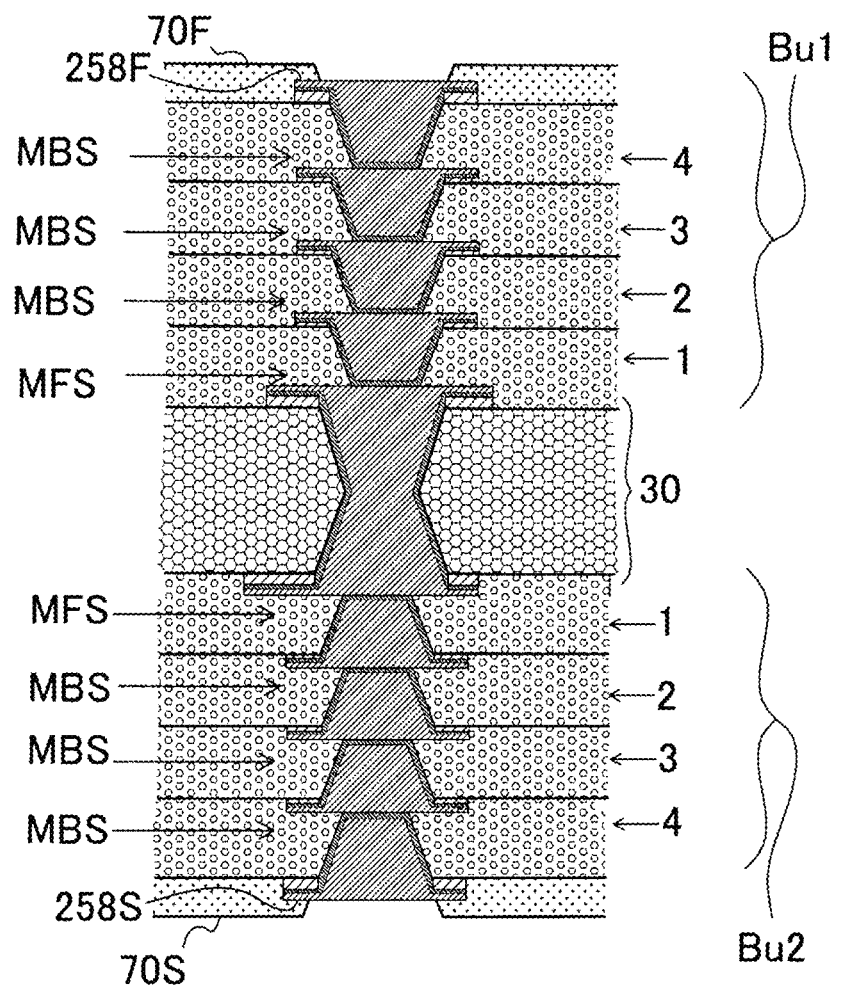
FIG. 9A is an explanatory diagram of a printed wiring board of the embodiment.

The resin insulating layers each having a small rough surface in the first build-up layer (Bu1) and the resin insulating layers each having a small rough surface in the second build-up layer (Bu2) are symmetrically formed with respect to the core substrate. The resin insulating layers each having a large rough surface in the first build-up layer (Bu1) and the resin insulating layers each having a large rough surface in the second build-up layer (Bu2) are symmetrically formed with respect to the core substrate. An example of this case is illustrated in FIG. 9A. In FIG. 9A, numbers are sequentially assigned to the resin insulating layers. The number "1" is assigned to the resin insulating layers formed directly on the core substrate, and the largest number is assigned to the outermost resin insulating layers. In FIG. 9A, the number "4" is assigned to the outermost resin insulating layers.

As illustrated in FIG. 9A, when the inner side resin insulating layer indicated by the number "1" in the first build-up layer is a resin insulating layer (MFS) having a small rough surface, the inner side resin insulating layer indicated by the number "1" in the second build-up layer is a resin insulating layer (MFS) having a small rough surface. When the inner side resin insulating layer indicated by the number "2" in the first build-up layer is a resin insulating layer (MBS) having a large rough surface, the inner side resin insulating layer indicated by the number "2" in the second build-up layer is a resin insulating layer (MBS) having a large rough surface. In FIG. 9A, the inner side resin insulating layers each indicated by the number "3" are resin insulating layers (MBS) each having a large rough surface.

The outermost first resin insulating layer (250F) is a resin insulating layer (MBS) having a large rough surface, and the outermost second resin insulating layer (250S) is a resin insulating layer (MBS) having a large rough surface.

Examples of the roughnesses (sizes) of the rough surfaces are described below.

The third roughness (rz3) is the smallest among the third roughness (rz3), the first roughness (rz1), the second roughness (rz2), the fifth roughness (rz5) and the ninth roughness (rz9). The first roughness (rz1), the second roughness (rz2), the fifth roughness (rz5) and the ninth roughness (rz9) are substantially equal to each other. And, the thirteenth roughness (rz13) is substantially equal to the third roughness (rz3). Or, the thirteenth roughness (rz13) is substantially equal to the first roughness (rz1).

The seventh roughness (rz7) is the smallest among the seventh roughness (rz7), the first roughness (rz1), the second roughness (rz2), the fifth roughness (rz5) and the ninth roughness (rz9). The first roughness (rz1), the second roughness (rz2), the fifth roughness (rz5) and the ninth roughness (rz9) are substantially equal to each other. And, the seventeenth roughness (rz17) and the seventh roughness (rz7) are substantially equal to each other. Or, the seventeenth roughness (rz17) is substantially equal to the first roughness (rz1).

The third roughness (rz3) and the seventh roughness (rz7) are substantially equal to each other. The thirteenth roughness (rz13) and the seventeenth roughness (rz17) are substantially equal to each other.

Among the inner side resin insulating layers, the size of the rough surface of a resin insulating layer having a small rough surface is smaller than the sizes of the rough surfaces of the outermost resin insulating layers and the sizes of the rough surfaces of the core layer. And, the sizes of the rough surfaces of the outermost resin insulating layers are larger than the sizes of the rough surfaces of the core layer.

As illustrated in FIG. 2A, a cross-sectional shape of each of first conductor circuits forming the first conductor layer (34F) is substantially a trapezoid. Each first conductor circuit has first base angles (θtfl, θtfr) between a bottom surface of the first conductor circuit and side surfaces of the first conductor circuit.

A cross-sectional shape of each of second conductor circuits forming the second conductor layer (34S) is substantially a trapezoid. Each second conductor circuit has second base angles (θtsl, θtsr) between a bottom surface of the second conductor circuit and side surfaces of the second conductor circuit.

A cross-sectional shape of each of inner side first conductor circuits forming the inner side first conductor layer (58F) is substantially a trapezoid. Each inner side first conductor circuit has inner side first base angles (θsfl, θsfr) between a bottom surface of the inner side first conductor circuit and side surfaces of the inner side first conductor circuit.

A cross-sectional shape of each of inner side second conductor circuits forming the inner side second conductor layer (58S) is substantially a trapezoid. Each inner side second conductor circuit has inner side second base angles (θssl, θssr) between a bottom surface of the inner side second conductor circuit and side surfaces of the inner side second conductor circuit.

A cross-sectional shape of each of inner side third conductor circuits forming the inner side third conductor layer (158F) is substantially a trapezoid. Each inner side third conductor circuit has inner side third base angles (θgfl, θgfr) between a bottom surface of the inner side third conductor circuit and side surfaces of the inner side third conductor circuit.

A cross-sectional shape of each of inner side fourth conductor circuits forming the inner side fourth conductor layer (158S) is substantially a trapezoid. Each inner side fourth conductor circuit has inner side fourth base angles (θgsl, θgsr) between a bottom surface of the inner side fourth conductor circuit and side surfaces of the inner side fourth conductor circuit.

A cross-sectional shape of each of outermost first conductor circuits forming the outermost first conductor layer (258F) is substantially a trapezoid. Each outermost first conductor circuit has outermost first base angles (θufl, θufr) between a bottom surface of the outermost first conductor circuit and side surfaces of the outermost first conductor circuit.

A cross-sectional shape of each of outermost second conductor circuits forming the outermost second conductor layer (258S) is substantially a trapezoid. Each outermost second conductor circuit has outermost second base angles (θusl, θusr) between a bottom surface of the outermost second conductor circuit and side surfaces of the outermost second conductor circuit.

The base angles are illustrated in FIG. 2A.

The size of a base angle is related to the size of a rough surface. When the size of a rough surface is small, the base angles of a conductor circuit formed on the rough surface are large. And, when the size of a rough surface is large, the base angles of a conductor circuit formed on the rough surface are small.

The printed wiring board 10 of the embodiment includes one or more resin insulating layers each having a large rough surface and one or more resin insulating layers each having a small rough surface. Base angles of conductor circuits formed a resin insulating layer having a small rough surface are larger than base angles of conductor circuits formed on a resin insulating layer having a large rough surface. Therefore, the printed wiring board 10 of the embodiment has conductor layers each formed by conductor circuits having small base angles and conductor layers each formed by conductor circuits having large base angles. When the size of a small base angle and the size of a large base angle are compared to each other, a ratio ((the size of a large base angle)/(the size of a small base angle)) of the size of a large base angle to the size of a small base angle is larger than 1. Small base angles include relatively small base angles, and large base angles include relatively large base angles.

The conductor layers (the first conductor layer (34F) and the second conductor layer (34S)) forming the core substrate are each formed conductor circuits having small base angles.

The outermost conductor layers (the outermost first conductor layer (258F) and the outermost second conductor layer (258S)) are each formed by conductor circuits having small base angles.

Among the inner side conductor layers in the first build-up layer (Bu1), at least one inner side conductor layer is formed by conductor circuits having large base angles.

When there are 2 or more inner side conductor layers in the first build-up layer (Bu1), one or more conductor layers each formed by conductor circuits having large base angles and one or more conductor layers each formed by conductor circuits having small base angles coexist.

When there are 3 or more inner side conductor layers in the first build-up layer (Bu1), ⅔ or more of the inner side conductor layers are conductor layers each formed by conductor circuits having large base angles.

Among the inner side conductor layers in the second build-up layer (Bu2), at least one inner side conductor layer is formed by conductor circuits having large base angles.

When there are 2 or more inner side conductor layers in the second build-up layer (Bu2), one or more conductor layers each formed by conductor circuits having large base angles and one or more conductor layers each formed by conductor circuits having small base angles coexist.

When there are 3 or more inner side conductor layers in the second build-up layer (Bu2), ⅔ or more of the inner side conductor layers are conductor layers each formed by conductor circuits having large base angles.

The conductor layers each formed by conductor circuits having small base angles in the first build-up layer (Bu1) and the conductor layers each formed by conductor circuits having small base angles in the second build-up layer (Bu2) are symmetrically formed with respect to the core substrate. The conductor layers each formed by conductor circuits having large base angles in the first build-up layer (Bu1) and the conductor layers each formed by conductor circuits having large base angles in the second build-up layer (Bu2) are symmetrically formed with respect to the core substrate.

Examples of the base angles are described below.

Sizes of the inner side first base angles (θsfl, θsfr) are the largest among the sizes of the inner side first base angles (θsfl, θsfr), sizes of the first base angles (θtfl, θtfr), sizes of the second base angles (θtsl, θtsr), sizes of the outermost first base angles (θufl, θufr) and sizes of the outermost second base angles (θusl, θusr). The sizes of the first base angles (θtfl, θtfr), the sizes of the second base angles (θtsl, θtsr), the sizes of the outermost first base angles (θufl, θufr) and the sizes of the outermost second base angles (θusl, θusr) are substantially equal to each other. And, sizes of the inner side third base angles (θgfl, θgfr) are substantially equal to the sizes of the inner side first base angles (θsfl, θsfr). Or, the sizes of the inner side third base angles (θgfl, θgfr) are substantially equal to the sizes of the first base angles (θtfl, θtfr).

Sizes of the inner side second base angles (θssl, θssr) are the largest among the sizes of the inner side second base angles (θssl, θssr), sizes of the first base angles (θtfl, θtfr), sizes of the second base angles (θtsl, θtsr), sizes of the outermost first base angles (θufl, θufr) and sizes of the outermost second base angles (θusl, θusr). The sizes of the first base angles (θtfl, θtfr), the sizes of the second base angles (θtsl, θtsr), the sizes of the outermost first base angles (θufl, θufr) and the sizes of the outermost second base angles (θusl, θusr) are substantially equal to each other. And, sizes of the inner side fourth base angles (θgsl, θgsr) are substantially equal to the sizes of the inner side second base angles (θssl, θssr). Or, the sizes of the inner side fourth base angles (θgsl, θgsr) are substantially equal to the sizes of the second base angles (θtsl, θtsr).

The sizes of the inner side first base angles (θsfl, θsfr) and the sizes of the inner side second base angles (θssl, θssr) are substantially equal to each other.

The base angles of the conductor circuits forming the conductor layers (34F, 34S) of the core substrate 30 are larger than the base angles of the conductor circuits forming the outermost conductor layers (258F, 258S). The base angles of the conductor circuits forming the outermost conductor layers (258F, 258S) are larger than the base angles of the conductor circuits having small base angles in the inner side conductor layers.

Figure 9B:
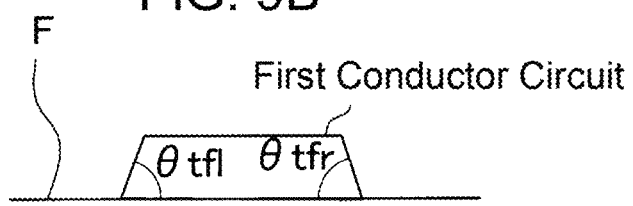
FIG. 9B is an explanatory diagram of a first conductor circuit in a first conductor layer.

The sizes of the base angles are described using the first conductor layer as an example. FIG. 9B illustrates a first conductor circuit in the first conductor layer.

The first base angles includes the first base angle (θtfl) formed on a left side and the first base angle (θtfr) formed on a right side. When the size of the first base angle (θtfl) formed on the left side and the size of the first base angle (θtfr) formed on the right side are different from each other, the first base angles are represented by a larger base angle among the two first base angles (θtfl, θtfr). The base angles of the conductor circuits in the conductor layers are represented similarly to the first conductor layer.

In the printed wiring board 10 of the embodiment, the conductor layers (the first conductor layer (34F) and the second conductor layer (34S)) that form the core substrate 30 are connected to each other by the through-hole conductors 36. The first conductor layer (34F) has the first through-hole lands (36F) of the through-hole conductors respectively around and directly on the through-hole conductors 36. Further, the second conductor layer (34S) has the second through-hole lands (36S) of the through-hole conductors respectively formed around and directly on the through-hole conductors 36. The first through-hole lands (36F) and the second through-hole lands (36S) respectively extend from the through-hole conductors 36. The first through-hole lands (36F) and the second through-hole lands (36S) are respectively directly connected to the through-hole conductors 36. The first through-hole lands (36F) are respectively integrally formed with the through-hole conductors 36. The second through-hole lands (36S) are respectively integrally formed with the through-hole conductors 36. Therefore, the connection reliability between the through-hole conductors 36 and first conductor layer (34F) or between the through-hole conductors 36 and the second conductor layer (34S) can be increased.

Figure 8A:
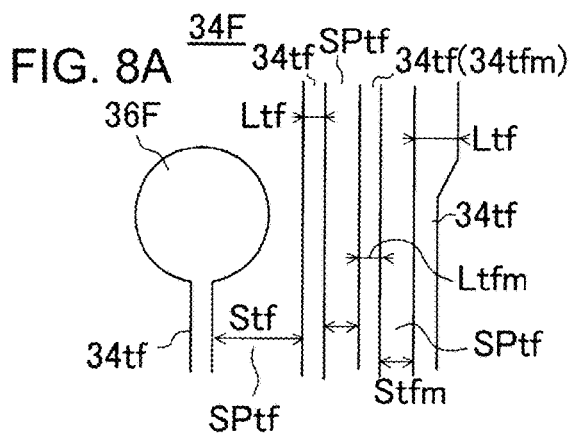
FIG. 8A-8H are plan views of conductor layers of the printed wiring board of the embodiment.

FIG. 8A is a plan view of the first conductor layer (34F).

The first conductor layer (34F) is formed by the first through-hole lands (36F) respectively connected to the through-hole conductors 36, multiple first conductor circuits (34*tf*), and first spaces (SPtf) between adjacent first conductor circuits. The first conductor circuits (34*tf*) have various first conductor circuit widths (Ltf), and the first conductor circuit widths (Ltf) include a minimum first conductor circuit width (minimum wiring width) (Ltfm). The first spaces (SPtf) have various first space widths (Stf), and the first space widths (Stf) include a minimum first space width (minimum insulation distance) (Stfm). The first space widths (Stf) are distances between adjacent first conductor circuits (34*tf*). A first conductor circuit having the minimum first conductor circuit width (Ltfm) forms a minimum first conductor circuit (34*tfm*). The minimum first conductor circuit (34*tfm*) also has the first base angles (θtfl, θtfr) illustrated in FIG. 2A.

Figure 8B:
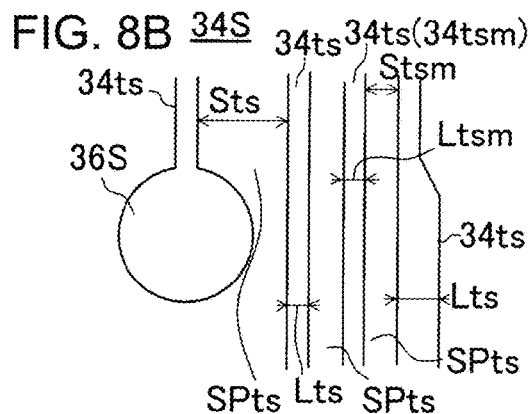

FIG. 8B is a plan view of the second conductor layer (34S).

The second conductor layer (34S) is formed by the second through-hole lands (36S) respectively connected to the through-hole conductors 36, multiple second conductor circuits (34ts), and second spaces (SPts) between adjacent second conductor circuits. The second conductor circuits (34ts) have various second conductor circuit widths (Lts), and the second conductor circuit widths (Lts) include a minimum second conductor circuit width (minimum wiring width) (Ltsm). The second spaces (SPts) have various second space widths (Sts), and the second space widths (Sts) include a minimum second space width (minimum insulation distance) (Stsm). The second space widths (Sts) are distances between adjacent second conductor circuits (34ts). A second conductor circuit having the minimum second conductor circuit width (Ltsm) forms a minimum second conductor circuit (34tsm). The minimum second conductor circuit (34tsm) also has the second base angles ($\theta$tsl, $\theta$tsr) illustrated in FIG. 2A.

Figure 8C:
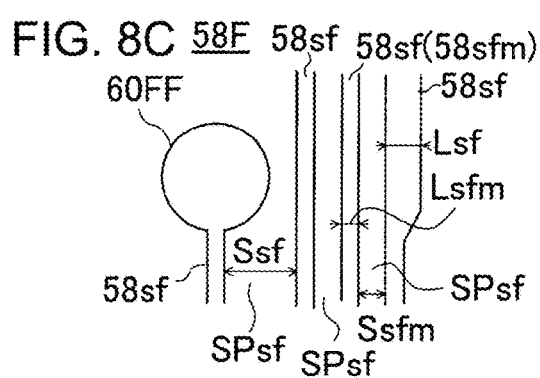

FIG. 8C is a plan view of the inner side first conductor layer (58F).

The inner side first conductor layer (58F) is formed by the first via lands (60FF) respectively formed directly on the first via conductors (60F), multiple inner side first conductor circuits (58sf), and inner side first spaces (SPsf) between adjacent inner side first conductor circuits (58sf). The inner side first conductor circuits (58sf) have various inner side first conductor circuit widths (Lsf), and the inner side first conductor circuit widths (Lsf) include a minimum inner side first conductor circuit width (minimum wiring width) (Lsfm). The inner side first spaces (SPsf) have various inner side first space widths (Ssf), and the inner side first space widths (Ssf) include a minimum inner side first space width (minimum insulation distance) (Ssfm). The inner side first space widths (Ssf) are distances between adjacent inner side first conductor circuits (58sf). An inner side first conductor circuit having the minimum inner side first conductor circuit width (Lsfm) forms a minimum inner side first conductor circuit (58sfm). The minimum inner side first conductor circuit (58sfm) also has the inner side first base angles ($\theta$sfl, $\theta$sfr) illustrated in FIG. 2A.

Figure 8D:
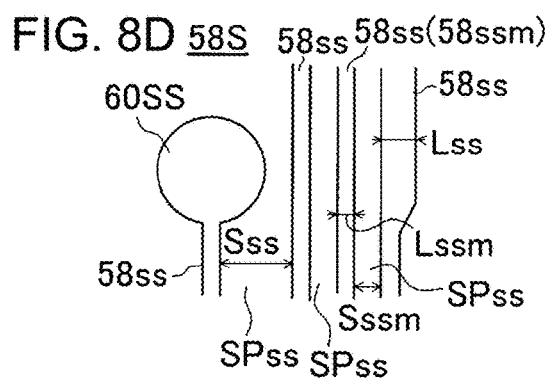

FIG. 8D is a plan view of the inner side second conductor layer (58S).

The inner side second conductor layer (58S) is formed by the inner side second via lands (60SS) respectively formed directly on the second via conductors (60S), multiple inner side second conductor circuits (58ss), and multiple inner side second spaces (SPss) between adjacent inner side second conductor circuits (58ss). The inner side second conductor circuits (58ss) have various inner side second conductor circuit widths (Lss), and the inner side second conductor circuit widths (Lss) include a minimum inner side second conductor circuit width (minimum wiring width) (Lssm). An inner side second conductor circuit having the minimum inner side second conductor circuit width (Lssm) forms a minimum inner side second conductor circuit (58ssm). The inner side second spaces (SPss) have various inner side second space widths (Sss), and the inner side second space widths (Sss) include a minimum inner side second space width (minimum insulation distance) (Sssm). The minimum inner side second conductor circuit (58ssm) also has the inner side second base angles ($\theta$ssl, $\theta$ssr) illustrated in FIG. 2A. The inner side second space widths (Sss) are distances between adjacent inner side second conductor circuits (58ss).

Figure 8E:
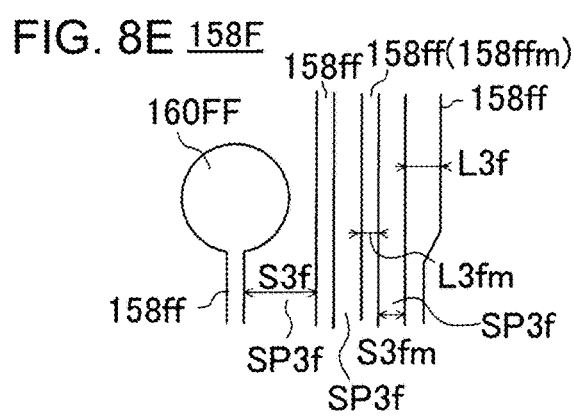

FIG. 8E is a plan view of the inner side third conductor layer (158F).

The inner side third conductor layer (158F) is formed by the inner side third via lands (160FF) respectively formed directly on the third via conductors (160F), multiple inner side third conductor circuits (158ff), and inner side third spaces (SP3f) between adjacent inner side third conductor circuits (158ff). The inner side third conductor circuits (158ff) have various inner side third conductor circuit widths (L3f), and the inner side third conductor circuit widths (L3f) include a minimum inner side third conductor circuit width (minimum wiring width) (L3fm). An inner side third conductor circuit having the minimum inner side third conductor circuit width (L3fm) forms a minimum inner side third conductor circuit (158ffm). The inner side third spaces (SP3f) have various inner side third space widths (S3f), and the inner side third space widths (S3f) include a minimum inner side third space width (minimum insulation distance) (S3fm). The inner side third space widths (S3f) are distances between adjacent inner side third conductor circuits (158ff). The minimum inner side third conductor circuit (158ffm) also has the inner side third base angles ($\theta$gfl, $\theta$gfr) illustrated in FIG. 2A.

Figure 8F:
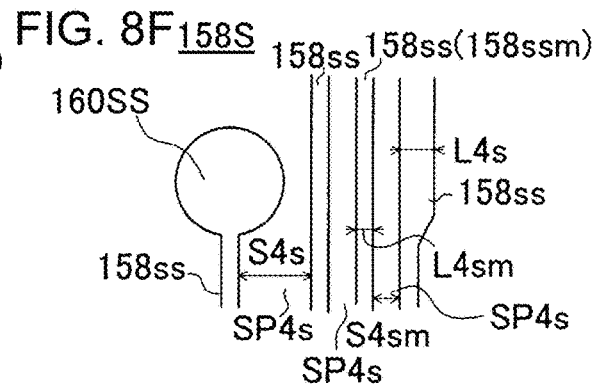

FIG. 8F is a plan view of the inner side fourth conductor layer (158S).

The inner side fourth conductor layer (158S) is formed by the inner side fourth via lands (160SS) respectively formed directly on the fourth via conductors (160S), multiple inner side fourth conductor circuits (158ss), and inner side fourth spaces (SP4s) between adjacent inner side fourth conductor circuits (158ss). The inner side fourth conductor circuits (158ss) have various inner side fourth conductor circuit widths (L4s). The inner side fourth conductor circuit widths (L4s) include a minimum inner side fourth conductor circuit width (minimum wiring width) (L4sm). An inner side fourth conductor circuit having the minimum inner side fourth conductor circuit width (L4sm) forms a minimum inner side fourth conductor circuit (158ssm). The inner side fourth spaces (SP4s) have various inner side fourth space widths (S4s), and the inner side fourth space widths (S4s) include a minimum inner side fourth space width (minimum insulation distance) (S4sm). The inner side fourth space widths (S4s) are distances between adjacent inner side fourth conductor circuits (158ss). The minimum inner side fourth conductor circuit (158ssm) also has the inner side fourth base angles ($\theta$gsl, $\theta$gsr) illustrated in FIG. 2A.

Figure 8G:
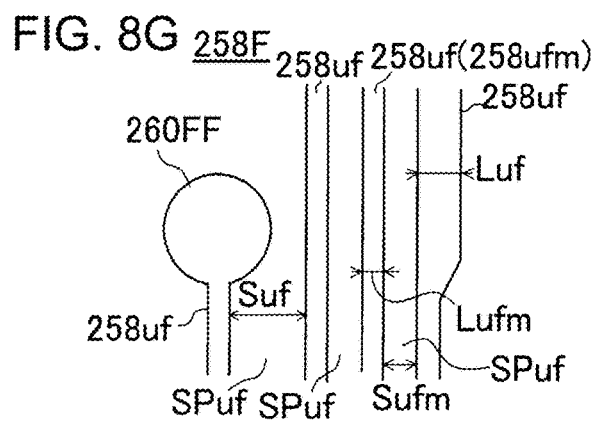

FIG. 8G is a plan view of the outermost first conductor layer (258F).

The outermost first conductor layer (258F) is formed by the outermost first via lands (260FF) respectively formed directly on the outermost first via conductors (260F), multiple outermost first conductor circuits (258uf), and outermost first spaces (SPuf) between adjacent outermost first conductor circuits (258uf). The outermost first conductor circuits (258uf) have various outermost first conductor circuit widths (Luf), and the outermost first conductor circuit widths (Luf) include a minimum outermost first conductor circuit width (minimum wiring width) (Lufm). The outermost first spaces (SPuf) have various outermost first space widths (Suf), and the outermost first space widths (Suf) include a minimum outermost first space width (minimum insulation distance) (Sufm). The outermost first space widths (Suf) are distances between adjacent outermost first conductor circuits (258uf). An outermost first conductor circuit having the minimum outermost first conductor circuit width (Lufm) forms a minimum outermost first conductor circuit (258ufm). The minimum outermost first conductor circuit (258ufm) also has the outermost first base angles (θufl, θufr) illustrated in FIG. 2A.

Figure 8H:
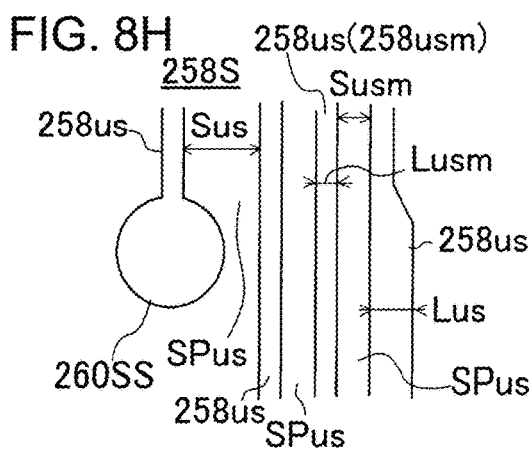

FIG. 8H is a plan view of the outermost second conductor layer (258S).

The outermost second conductor layer (258S) is formed by the outermost second via lands (260SS) respectively formed directly on the outermost second via conductors (260S), multiple outermost second conductor circuits (258us), and outermost second spaces (SPus) between adjacent outermost second conductor circuits (258us). The outermost second conductor circuits (258us) have various outermost second conductor circuit widths (Lus), and the outermost second conductor circuit widths (Lus) include a minimum outermost second conductor circuit width (minimum wiring width) (Lusm). The outermost second spaces (SPus) have various outermost second space widths (Sus), and the outermost second space widths (Sus) include a minimum outermost second space width (minimum insulation distance) (Susm). The outermost second space widths (Sus) are distances between adjacent outermost second conductor circuits (258us). An outermost second conductor circuit having the minimum outermost second conductor circuit width (Lusm) forms a minimum outermost second conductor circuit (258usm).

The minimum outermost second conductor circuit (258usm) also has the outermost second base angles (θusl, θusr) illustrated in FIG. 2A.

The minimum conductor circuit widths existing in the conductor layers are related to the sizes of the rough surfaces. A minimum conductor circuit width existing in a conductor layer formed on a large rough surface is larger than a minimum conductor circuit width existing in a conductor layer formed on a small rough surface.

The minimum conductor circuit widths existing in the conductor layers are related to the base angles of the conductor circuits. A minimum conductor circuit width existing in a conductor layer formed by conductor circuits having large base angles is smaller than a minimum conductor circuit width existing in a conductor layer formed by conductor circuits having small base angles.

Minimum space widths existing in the conductor layers are related to the sizes of the rough surfaces. A minimum space width existing in a conductor layer formed on a large rough surface is larger than a minimum space width existing in a conductor layer formed on a small rough surface.

The minimum space widths existing in the conductor layers are related to the base angles of the conductor circuits. A minimum space width existing in a conductor layer formed by conductor circuits having large base angles is smaller than a minimum space width existing in a conductor layer formed by conductor circuits having small base angles.

An example of the printed wiring board 10 of the embodiment illustrated in FIG. 2A is described below.

The minimum inner side first conductor circuit width (Lsfm) is the smallest among the minimum inner side first conductor circuit width (Lsfm), the minimum first conductor circuit width (Ltfm), the minimum second conductor circuit width (Ltsm), the minimum outermost first conductor circuit width (Lufm) and the minimum outermost second conductor circuit width (Lusm). And, the minimum inner side third conductor circuit width (L3fm) is substantially equal to the minimum inner side first conductor circuit width (Lsfm). Or, the minimum inner side third conductor circuit width (L3fm), the minimum first conductor circuit width (Ltfm), the minimum second conductor circuit width (Ltsm), the minimum outermost first conductor circuit width (Lufm) and the minimum outermost second conductor circuit width (Lusm) are substantially equal to each other.

The minimum inner side second conductor circuit width (Lssm) is the smallest among the minimum inner side second conductor circuit width (Lssm), the minimum first conductor circuit width (Ltfm), the minimum second conductor circuit width (Ltsm), the minimum outermost first conductor circuit width (Lufm) and the minimum outermost second conductor circuit width (Lusm). And, the minimum inner side fourth conductor circuit width (L4sm) is substantially equal to the minimum inner side second conductor circuit width (Lssm). Or, the minimum inner side fourth conductor circuit width (L4sm), the minimum first conductor circuit width (Ltfm), the minimum second conductor circuit width (Ltsm), the minimum outermost first conductor circuit width (Lufm) and the minimum outermost second conductor circuit width (Lusm) are substantially equal to each other.

The minimum inner side first space width (Ssfm) is the smallest among the minimum inner side first space width (Ssfm), the minimum first space width (Stfm), the minimum second space width (Stsm), the minimum outermost first space width (Sufm) and the minimum outermost second space width (Susm). And, the minimum inner side third space width (S3fm) is substantially equal to the minimum inner side first space width (Ssfm). Or, the minimum inner side third space width (S3fm), the minimum first space width (Stfm), the minimum second space width (Stsm), the minimum outermost first space width (Sufm) and the minimum outermost second space width (Susm) are substantially equal to each other.

The minimum inner side second space width (Sssm) is the smallest among the minimum inner side second space width (Sssm), the minimum first space width (Stfm), the minimum second space width (Stsm), the minimum outermost first space width (Sufm) and the minimum outermost second space width (Susm). And, the minimum inner side fourth space width (minimum insulation distance) (S4sm) is substantially equal to the minimum inner side second space width (Sssm). Or, the minimum inner side fourth space width (S4sm), the minimum first space width (Stfm), the minimum second space width (Stsm), the minimum outermost first space width (Sufm) and the minimum outermost second space width (Susm) are substantially equal to each other.

Therefore, fine conductor circuits can be formed in the inner side conductor layers in the first build-up layer (Bu1) and in the inner side conductor layers in the second build-up layer (Bu2). For example, wiring densities of the inner side first conductor layer (58F) and the inner side second conductor layer (58S) can be increased. The printed wiring board can be reduced in size. The printed wiring board can be reduced in thickness.

In the embodiment, for example, the inner side first conductor layer (58F) and the inner side second conductor layer (58S) have finer conductor circuits than other conductor layers. Therefore, it is advantageous to form conductor circuits for signals in the inner side first conductor layer (58F) and the inner side second conductor layer (58S). In order to transmit high-speed signals, unevennesses of surfaces of the conductor circuits (58sf) forming the inner side first conductor layer (58F) and unevennesses of surfaces of the conductor circuits (58ss) forming the inner side second conductor layer (58S) are preferably small. Therefore, in the embodiment, the size (rz3) of the rough surface of the first resin insulating layer (50F) supporting the inner side first conductor layer (58F) and the size (rz7) of the rough surface of the second resin insulating layer (50S) supporting the inner side second conductor layer (58S) are smaller than the size (rz1) of the rough surface of the first surface (F1) of the core layer 20, the size (rz2) of the rough surface of the second surface (S2) of the core layer 20, the size (rz5) of the rough surface of the outermost first resin insulating layer (250F), and the size (rz9) of the rough surface of the outermost second resin insulating layer (250S). When the roughnesses of the rough surfaces are small, the conductor circuits are likely to peel off from the resin insulating layers. In order to suppress occurrence of such a defect, in the embodiment, the inner side first base angles (θsfl, θsfr) are larger than the first base angles (θtfl, θtfr), the second base angles (θtsl, θtsr), the outermost first base angles (θufl, θufr), and the outermost second base angles (θusl, θusr). Further, in the embodiment, the inner side second base angles (θssl, θssr) are larger than the first base angles (θtfl, θtfr), the second base angles (θtsl, θtsr), the outermost first base angles (θufl, θufr), and the outermost second base angles (θusl, θusr). For example, assuming that the minimum conductor circuit widths of the minimum conductor circuits formed in the conductor layers are equal to each other, when a cross-sectional area of the minimum inner side first conductor circuit (58$sfm$) and a cross-sectional area of the minimum first conductor circuit (34$tfm$) are compared to each other, the cross-sectional area of the minimum inner side first conductor circuit (58$sfm$) is larger than the cross-sectional area of the minimum first conductor circuit (34$tfm$), and, when a cross-sectional area of the minimum inner side second conductor circuit (58$ssm$) and a cross-sectional area of the minimum second conductor circuit (34$tsm$) are compared to each other, the cross-sectional area of the minimum inner side second conductor circuit (58$ssm$) is larger than the cross-sectional area of the minimum second conductor circuit (34$tsm$). In this way, in the printed wiring board of the embodiment, the cross-sectional areas of the conductor circuits forming the inner side first conductor layer (58F) and the cross-sectional areas of conductor circuits forming the inner side second conductor layer (58S) can be increased. Since physical properties (for example, a thermal expansion coefficient) of the conductor layers and physical properties (for example, a thermal expansion coefficient) of the resin insulating layers are different from each other, a stress is thought to be accumulated in the conductor circuits due to a heat shock and the like. When a stress per unit area of conductor circuits (the former) having large cross-sectional areas and a stress per unit area of conductor circuits (the latter) having small cross-sectional areas are compared to each other, the stress per unit area of the former is larger than the stress per unit area of the latter. And, the stress is released in a form of heat or the like. Due to the release of the stress, it is expected that the stress is transmitted to interfaces between the conductor circuits and the rough surfaces of the resin insulating layers. When the stress per unit area is large and the roughnesses (sizes) of the rough surfaces are small, the conductor circuits are likely to peel off from the resin insulating layers. However, in the embodiment, the stress per unit area is small and the roughnesses (sizes) of the rough surfaces are small. Further, the cross-sectional areas of the first conductor circuits (34$tf$) forming the first conductor layer (34F) are smaller than the cross-sectional areas of the inner side first conductor circuits (58$sf$) forming the inner side first conductor layer (58F). However, the first conductor circuits (34$tf$) are bonded to the core layer 20 via the rough surface having a large roughness. Therefore, even when the stress per unit area is large, since the unevenness of the rough surface is large, the first conductor layer (34F) is unlikely to peel off from the core layer 20. Similar to the first conductor layer (34F), the second conductor layer (34S), the outermost first conductor layer (258F), and the outermost second conductor layer (258S) are unlikely to peel off from the resin insulating layers.

In this way, the roughnesses of the rough surfaces are related to the base angles. Base angles of conductor circuits formed on a small rough surface are large. Base angles of conductor circuits formed on a large rough surface are small. Base angles of conductor circuits formed a small rough surface are larger than base angles of conductor circuits for rued on a large rough surface.

Even when a high-speed signal is transmitted by the inner side first conductor layer (58F) or the inner side second conductor layer (58S), since the cross-sectional area is large, the signal can be transmitted with a low resistance. When the base angles are large, electrical resistances of the conductor circuits can be reduced. A data transmission speed can be increased.

Even when the inner side third conductor layer (158F) and the inner side fourth conductor layer (158S) are bonded to the resin insulating layers via small rough surfaces, similar to the inner side first conductor layer, the inner side third conductor layer (158F) and the inner side fourth conductor layer (158S) are unlikely to peel off from the resin insulating layers. High-speed signals can be transmitted by the conductor circuits included in the inner side third conductor layer (158F) and the inner side fourth conductor layer (158S).

Even when the inner side third conductor layer (158F) and the inner side fourth conductor layer (158S) are bonded to the resin insulating layers via large rough surfaces, similar to the inner side first conductor layer, the inner side third conductor layer (158F) and the inner side fourth conductor layer (158S) are unlikely to peel off from the resin insulating layers.

Manufacturing Method of Embodiment

A method for manufacturing the printed wiring board 10 of the embodiment is illustrated in FIG. 3A-7B.

A starting substrate (20$z$) illustrated in FIG. 3A is prepared. The starting substrate (20$z$) is formed by the core layer 20 having the first surface (F1) and the second surface (S2) on an opposite side with respect to the first surface (F1), the first metal foil (32$tf$) laminated on the first surface (F1) of the core layer 20, and the second metal foil (32$ts$) laminated on the second surface (S2) of the core layer 20. The first metal foil (32$tf$) has a first mat surface (32$tfm$) at an interface between the first surface (F1) of the core layer 20 and the first metal foil (32$tf$). The mat surface (32$tfm$) has a large unevenness. The second metal foil (32$ts$) has a second mat surface (32$tsm$) at an interface between the second surface (S2) of the core layer 20 and the second metal foil (32$ts$). The mat surface (32$tsm$) has a large unevenness. The core layer 20 is formed of a reinforcing material and a resin. The core layer 20 may have inorganic particles. Examples of the resin of the core layer 20 include an epoxy resin and a BT (bismaleimide triazine) resin. Examples of the reinforcing material of the core layer 20 include a glass cloth and an aramid fiber. Examples of the inorganic particles of the core layer 20 include silica particles and alumina particles.

As illustrated in FIG. 3B, $CO_2$ laser is irradiated to the first metal foil (32$tf$). The first openings (28F) are formed on the first surface (F1) side of the starting substrate (20$z$). The first openings (28F) are each tapered from the first surface toward the second surface (S2). Conditions of the laser are set such that the tapered shapes are formed. The conditions of the laser include the number of shots, a pulse width, an output, and the like. A diameter of a second shot can be set to be smaller than a diameter of a first shot.

As illustrated in FIG. 3C, CO2 laser is irradiated to the second metal foil (32ts). The second openings (28S) are formed on the second surface (S2) side of the starting substrate (20z). The second openings (28S) are each tapered from the second surface (S2) toward the first surface (F1). Conditions of the laser are set such that the tapered shapes are formed. The conditions of the laser include the number of shots, a pulse width, an output, and the like. A diameter of a second shot can be set to be smaller than a diameter of a first shot. The through holes 28 are formed by the first openings (28F) and the second openings (28S). A joining area (28P) is formed at a joining place between a first opening and a second opening. An outer periphery of the joining area (28P) forms a neck part (28C).

Figure 3D:
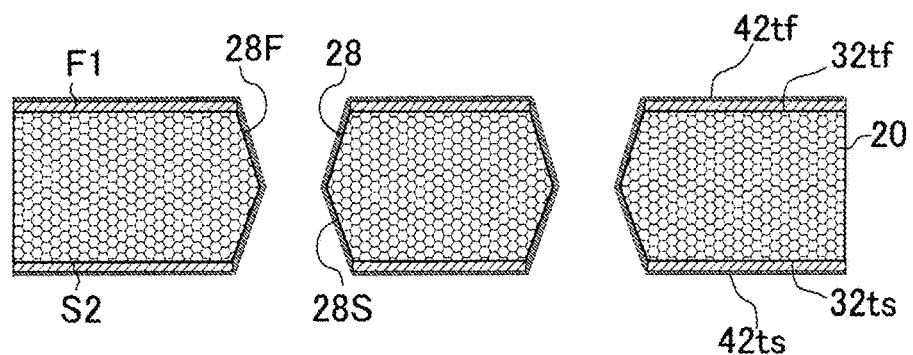
Figure 4A:
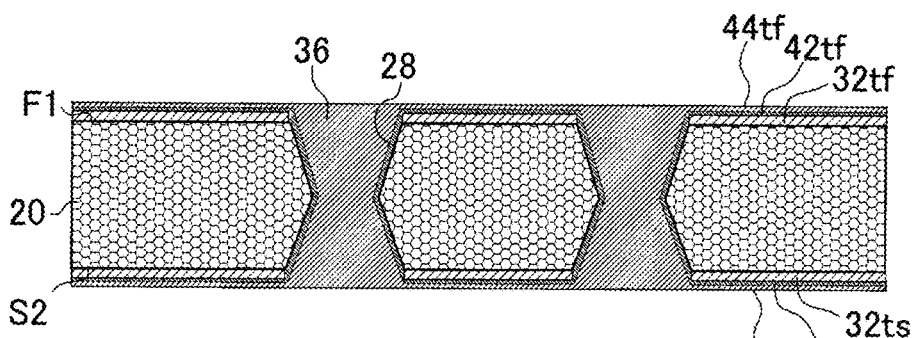
FIG. 4A-4D are manufacturing process diagrams of the printed wiring board of the embodiment.
Figure 4B:
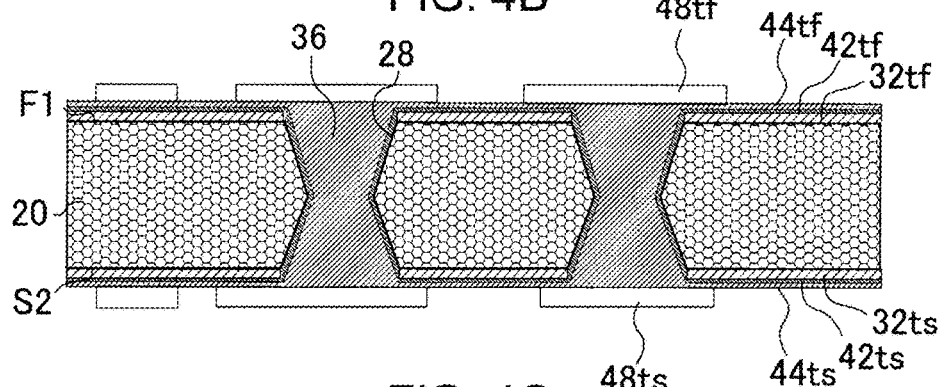
Figure 4C:
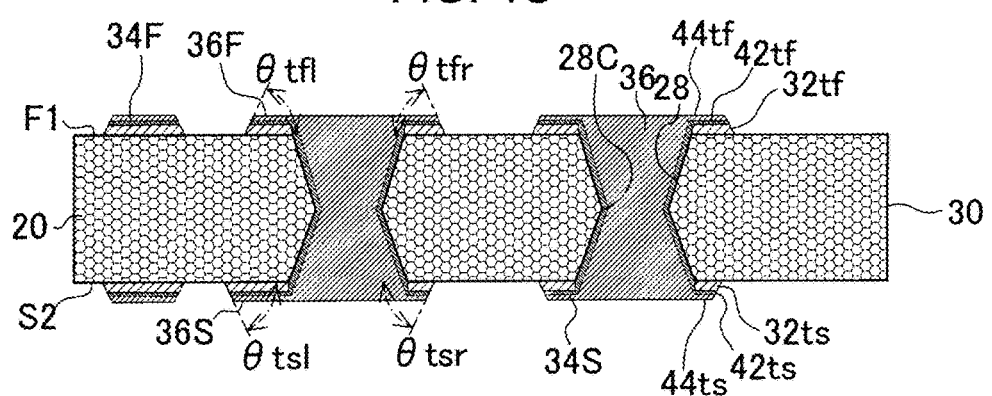

The first seed layer (42tf) and the second seed layer (42ts) are formed on the first metal foil (32tf), the second metal foil (32ts), and side walls of the through holes 28 by an electroless plating treatment (FIG. 3D). The first electrolytic plating film (44tf) is formed using the first seed layer (42tf), and the second electrolytic plating film (44ts) is formed using the second seed layer (42ts) (FIG. 4A). A first etching resist (48tf) is formed on the first electrolytic plating film (44tf). A second etching resist (48ts) is formed on the second electrolytic plating film (44ts) (FIG. 4B). The first electrolytic plating film (44tf), the first seed layer (42tf) and the first metal foil (32tf) exposed from the first etching resist are removed by etching. The second electrolytic plating film (44ts), the second seed layer (42ts) and the second metal foil (32ts) exposed from the second etching resist are removed by etching. The etching resists are removed, and the core substrate 30 is completed (FIG. 4C). The through-hole conductors 36 are respectively formed in the through holes 28. Simultaneously, the first conductor layer (34F) including the first through-hole lands (36F) and the second conductor layer (34S) including the second through-hole lands (36S) are formed. The first conductor layer (34F) and the second conductor layer (34S) are formed using a subtractive method. The first conductor layer (34F) and the second conductor layer (34S) belong to the conductor layers each having a large thickness.

In the embodiment, the joining area (28P) and the neck part (28C) are formed at a substantially central portion of each of the through holes 28. Therefore, when the through-hole conductors 36 are formed by plating, voids are unlikely to be generated in the through-hole conductors 36. Reliability of the through-hole conductors 36 is high. The first conductor layer (34F) includes the first metal foil (32tf), the first seed layer (42tf) formed on the first metal foil (32tf), and the first electrolytic plating film (44tf) formed on the first seed layer (42tf). The second conductor layer (34S) includes the second metal foil (32ts), the second seed layer (42ts) on the second metal foil (32ts), and the second electrolytic plating film (44ts) on the second seed layer (42ts). The first conductor layer (34F) has the first base angles (θtfl, θtfr), and the second conductor layer (34S) has the second base angles (θtsl, θtsr). The rough surface formed on the first surface (F1) of the core substrate 30 has the first roughness (rz1), and the rough surface formed on the second surface (S2) of the core substrate 30 has the second roughness (rz2).

The conductor layers of the core substrate are each formed by conductor circuits having small base angles. The rough surfaces of the core layer belong to large rough surfaces. The conductor layers (34F, 34S) of the core substrate belong to conductor layers each having a large thickness.

Figure 4D:
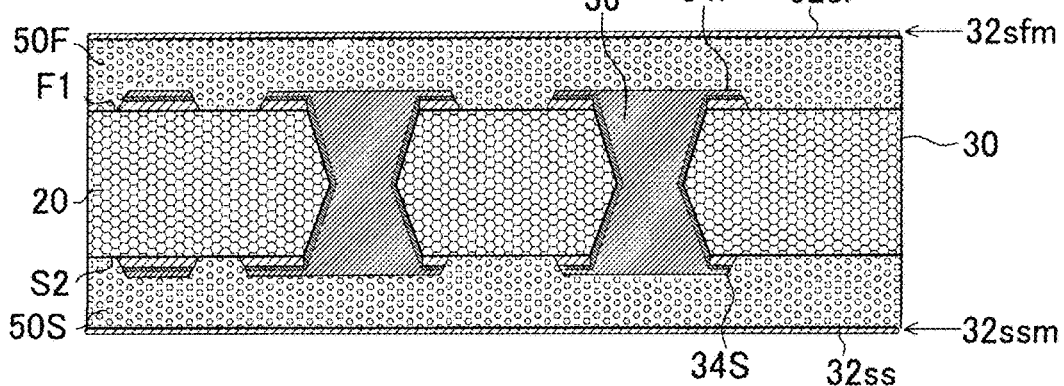
Figure 5A:
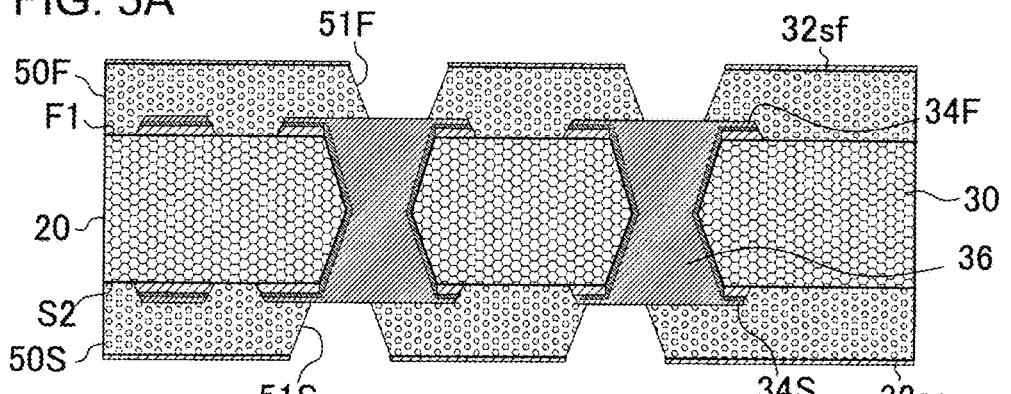
FIG. 5A-5D are manufacturing process diagrams of the printed wiring board of the embodiment.

The first resin insulating layer (50F) and the inner side first metal foil (32sf) are sequentially laminated on the first surface (F1) of the core substrate 30. The second resin insulating layer (50S) and the inner side second metal foil (32ss) are sequentially laminated on the second surface (S2) (FIG. 4D). The inner side first metal foil (32sf) has a mat surface (32sfm) at an interface between the third surface (F3) and the inner side first metal foil (32sf). The mat surface (32sfm) has a small unevenness. The inner side second metal foil (32ss) has a mat surface (32ssm) at an interface between the seventh surface (S7) and the inner side second metal foil (32ss). The mat surface (32ssm) has a small unevenness. The first resin insulating layer (50F) and the second resin insulating layer (50S) are each formed of a reinforcing material such as a glass cloth, inorganic particles such as silica particles, and a resin such as an epoxy resin. Using CO2 gas laser, openings (51F) penetrating the first resin insulating layer (50F) and the inner side first metal foil (32sf) and reaching the first conductor layer (34F) are formed, and openings (51S) penetrating the second resin insulating layer (50S) and the inner side second metal foil (32ss) and reaching the second conductor layer (34S) are formed (FIG. 5A).

Figure 5B:
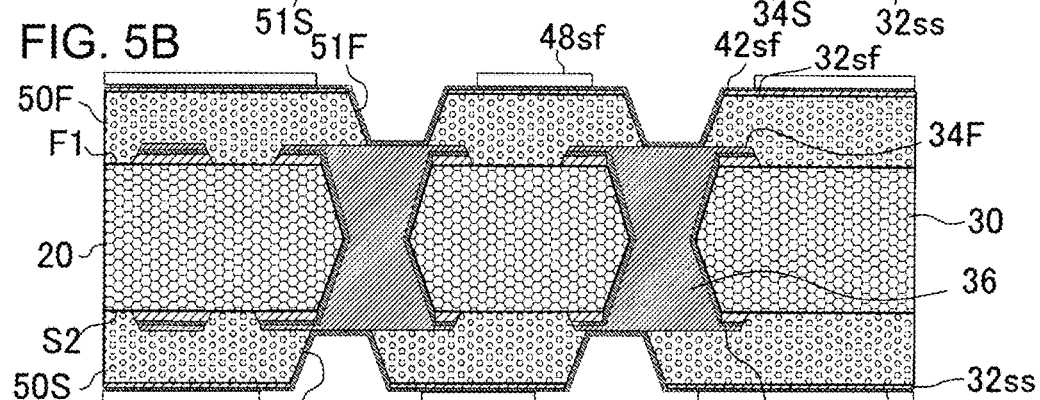
Figure 5C:
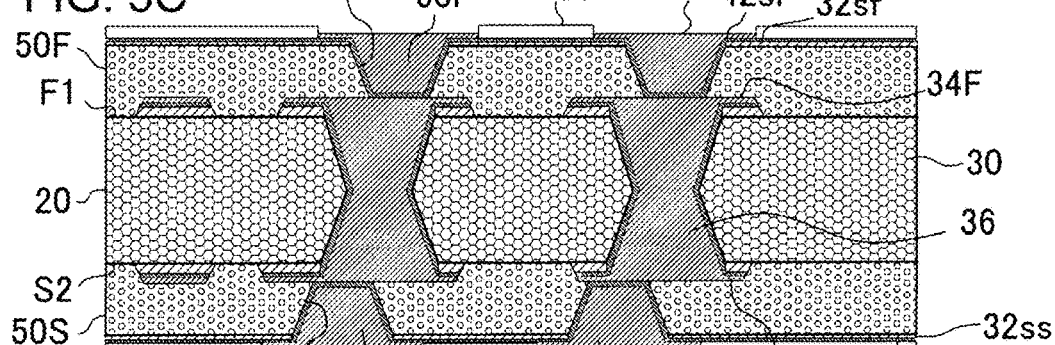

The inner side first seed layer (42sf) is formed on the inner side first metal foil (32sf) and on inner walls of the openings (51F). The inner side second seed layer (42ss) is formed on the inner side second metal foil (32ss) and on inner walls of the openings (51S). A plating resist (48sf) is formed on the inner side first seed layer (42sf), and a plating resist (48ss) is formed on the inner side second seed layer (42ss) (FIG. 5B). The inner side first electrolytic plating film (44sf) is formed on the inner side first seed layer (42sf) exposed from the plating resist (48sf). The inner side second electrolytic plating film (44ss) is formed on the inner side second seed layer (42ss) exposed from the plating resist (48ss). In this case, the openings (51F) are filled with the inner side first electrolytic plating film (44sf). The openings (51S) are filled with the inner side second electrolytic plating film (44ss). The first via conductors (60F) connecting to the first conductor layer (34F) are respectively formed in the openings (51F). The second via conductors (60S) connecting to the second conductor layer (34S) are respectively formed in the openings (51S) (FIG. 5C). The plating resists (48sf, 48ss) are removed.

Figure 5D:
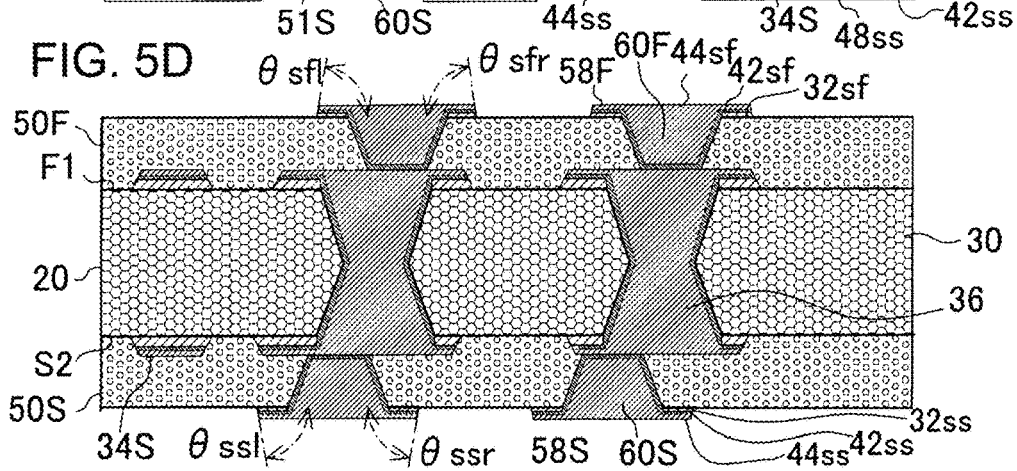

The inner side first seed layer (42sf) and the inner side first metal foil (32sf) exposed from the inner side first electrolytic plating film (44sf) are removed. The inner side second seed layer (42ss) and the inner side second metal foil (32ss) exposed from the inner side second electrolytic plating film (44ss) are removed. The inner side first conductor layer (58F) and the inner side second conductor layer (58S) are each formed by an MSAP (Modified Semi Additive Process) (FIG. 5D). The inner side first conductor layer (58F) includes the inner side first metal foil (32sf), the inner side first seed layer (42sf) on the inner side first metal foil (32sf), and the inner side first electrolytic plating film (44sf) on the inner side first seed layer (42sf). The inner side second conductor layer (58S) includes the inner side second metal foil (32ss), the inner side second seed layer (42ss) on the inner side second metal foil (32ss), and the inner side second electrolytic plating film (44ss) on the inner side second seed layer (42ss). The inner side first conductor layer (58F) has the inner side first base angles (θsfl, θsfr), and the inner side second conductor layer (58S) has the inner side second base angles (θssl, θssr). The rough surface of the first resin insulating layer (50F) has the third roughness (rz3), and the rough surface of the second resin insulating layer (50S) has the seventh roughness (rz7).

The inner side first conductor layer (58F) and the inner side second conductor layer (58S) are each formed from a metal foil having a small unevenness. Therefore, the first resin insulating layer (50F) and the second resin insulating layer (50S) each have a small rough surface. The first base angles and the second base angles belong to large base angles. The inner side first conductor layer (58F) and the inner side second conductor layer (58S) belong to conductor layers each having a small thickness.

The processes of FIG. 4D-5D are repeated.

The third resin insulating layer (150F) and the inner side third metal foil (32gf) are sequentially formed on the first resin insulating layer (50F) and the inner side first conductor layer (58F).

The fourth resin insulating layer (150S) and the inner side fourth metal foil (32gs) are sequentially formed on the second resin insulating layer (50S) and the inner side second conductor layer (58S).

The inner side third metal foil (32gf) has a mat surface (32gfm) at an interface between the thirteenth surface (F13) and the inner side third metal foil (32gf). The mat surface (32gfm) has a small unevenness. The inner side fourth metal foil (32gs) has a mat surface (32gsm) at an interface between the seventeenth surface (S17) and the inner side fourth metal foil (32gs). The mat surface (32gsm) has a small unevenness.

The inner side third conductor layer (158F) is formed on the third resin insulating layer (150F) by an MSAP. At the same time, the third via conductors (160F) are formed penetrating the third resin insulating layer (150F) and connecting the inner side first conductor layer (58F) and the inner side third conductor layer (158F) to each other. The inner side third conductor layer (158F) includes the inner side third metal foil (32gf), the inner side third seed layer (42gf) on the inner side third metal foil (32gf), and the inner side third electrolytic plating film (44gf) on the inner side third seed layer (42gf).

Figure 6A:
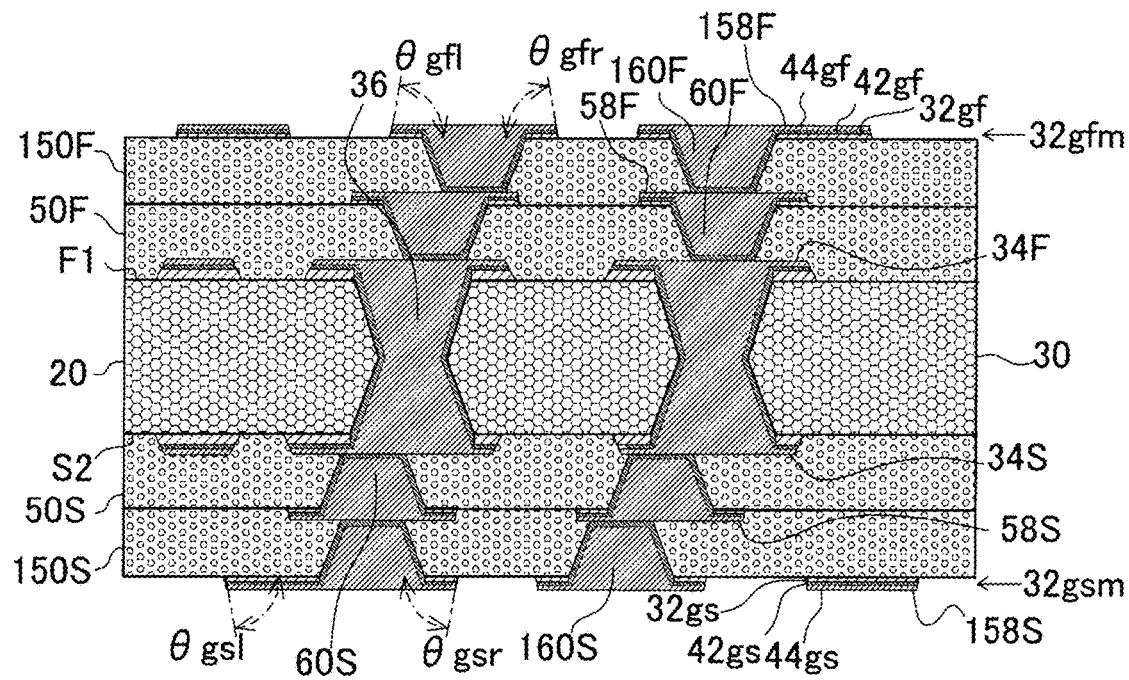
FIGS. 6A and 6B are manufacturing process diagrams of the printed wiring board of the embodiment.

The inner side fourth conductor layer (158S) is formed on the fourth resin insulating layer (150S) by an MSAP. At the same time, the fourth via conductors (160S) are formed penetrating the fourth resin insulating layer (150S) and connecting the inner side second conductor layer (58S) and the inner side fourth conductor layer (158S) to each other (FIG. 6A). The inner side fourth conductor layer (158S) includes the inner side fourth metal foil (32gs), the inner side fourth seed layer (42gs) on the inner side fourth metal foil (32gs), and the inner side fourth electrolytic plating film (44gs) on the inner side fourth seed layer (42gs). The inner side third conductor layer (158F) has the inner side third base angles ($\theta$gfl, $\theta$gfr), and the inner side fourth conductor layer (158S) has the inner side fourth base angles ($\theta$gsl, $\theta$gsr). The rough surface of the third resin insulating layer (150F) has the thirteenth roughness (rz13), and the rough surface of the fourth resin insulating layer (150S) has the seventeenth roughness (rz17).

The inner side third conductor layer (158F) and the inner side fourth conductor layer (158S) are each formed from a metal foil having a small unevenness. Therefore, the third resin insulating layer (150F) and the fourth resin insulating layer (150S) each have a small rough surface. The third base angles and the fourth base angles belong to large base angles. The inner side third conductor layer (158F) and the inner side fourth conductor layer (158S) belong to conductor layers each having a small thickness.

The outermost first resin insulating layer (250F) and the outermost first metal foil (32uf) are sequentially laminated on the third resin insulating layer (150F) and the inner side third conductor layer (158F).

The outermost second resin insulating layer (250S) and the outermost second metal foil (32us) are sequentially laminated on the fourth resin insulating layer (150S) and the inner side fourth conductor layer (158S).

The outermost first metal foil (32uf) has a mat surface (32ufm) at an interface between the fifth surface (F5) of the outermost first resin insulating layer (250F) and the outermost first metal foil (32uf). The mat surface (32ufm) has a large unevenness. The outermost second metal foil (32us) has a mat surface (32usm) at an interface between the ninth surface (S9) of the outermost second resin insulating layer (250S) and the outermost second metal foil (32us). The mat surface (32usm) has a large unevenness.

$CO_2$ gas laser is irradiated to the outermost first metal foil (32uf). Openings (251F) are formed penetrating the outermost first metal foil (32uf) and the outermost first resin insulating layer (250F) and reaching the inner side third conductor layer (158F).

Figure 6B:
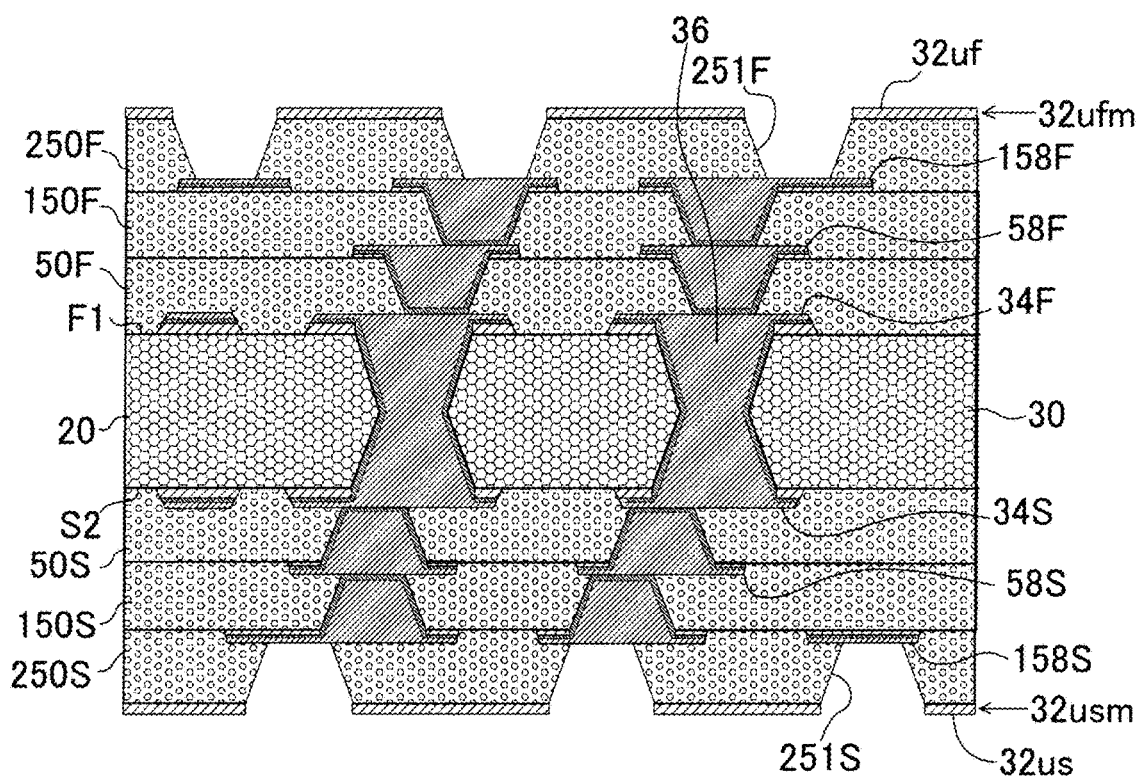

$CO_2$ gas laser is irradiated to the outermost second metal foil (32us). Openings (251S) are formed penetrating the outermost second metal foil (32us) and the outermost second resin insulating layer (250S) and reaching the inner side fourth conductor layer (158S) (FIG. 6B).

Figure 7A:
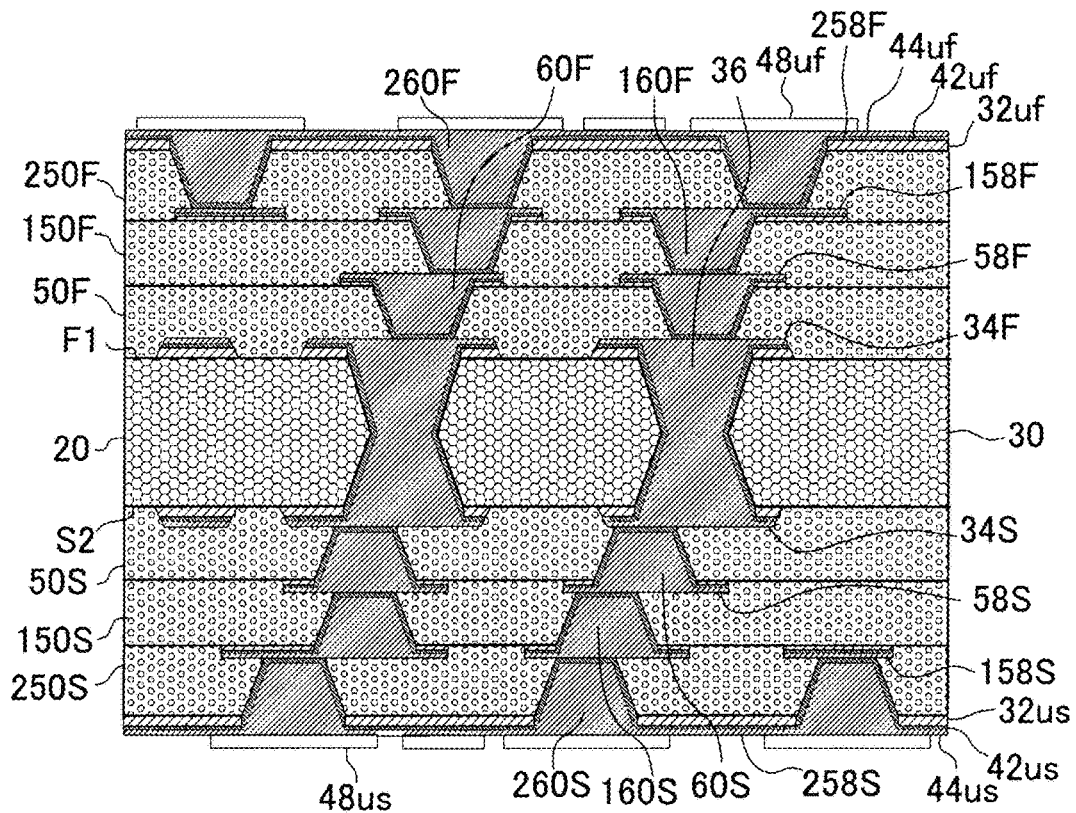
FIGS. 7A and 7B are manufacturing process diagrams of the printed wiring board of the embodiment.
Figure 7B:
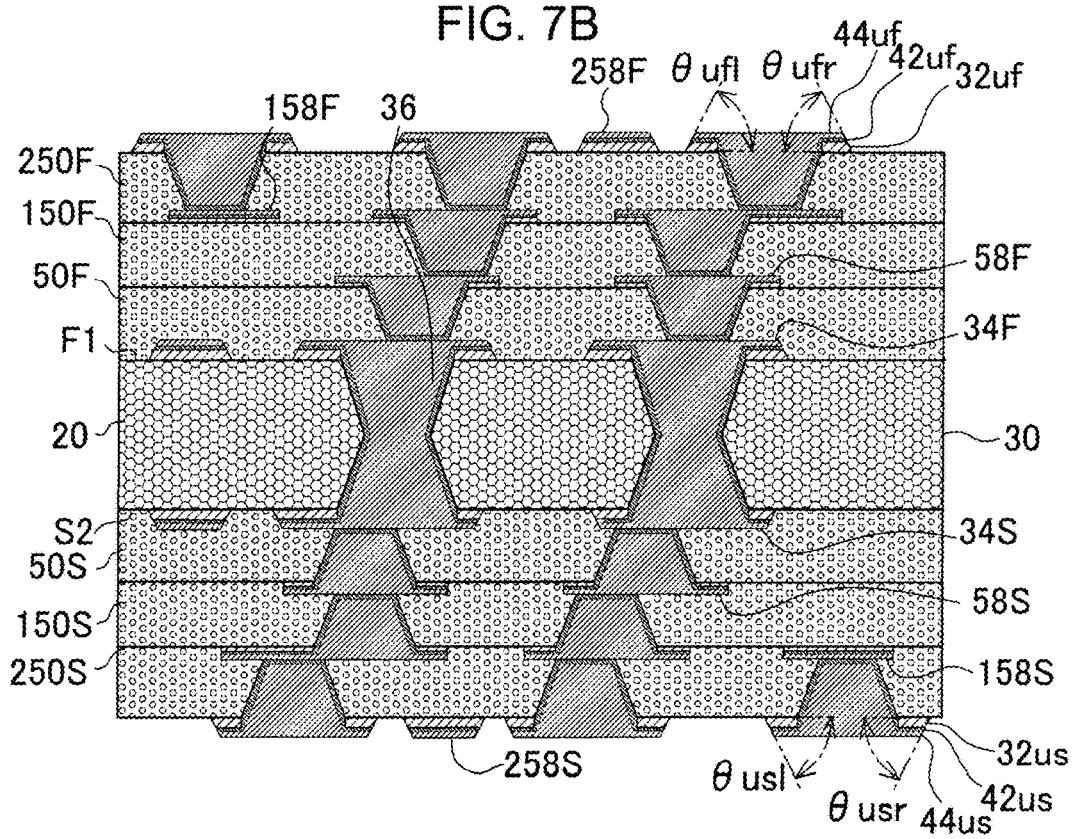

By an electroless plating treatment, the outermost first seed layer (42uf) is formed on the outermost first metal foil (32uf) and on inner walls of the openings (251F). The outermost second seed layer (42us) is formed on the outermost second metal foil (32us) and on inner walls of the openings (251S). By an electrolytic plating treatment, the outermost first electrolytic plating film (44uf) is formed on the outermost first seed layer (42uf). At the same time, the outermost first via conductors (260F) are respectively formed in the openings (251F). At the same time, the outermost second electrolytic plating film (44us) is formed on the outermost second seed layer (42us). The outermost second via conductors (260S) are respectively formed in the openings (251S). An etching resist (48uf) is formed on the outermost first electrolytic plating film (44uf). An etching resist (48us) is formed on the outermost second electrolytic plating film (44us) (FIG. 7A). The outermost first electrolytic plating film (44uf), the outermost first seed layer (42uf) and the outermost first metal foil (32uf) exposed from the etching resist (48uf) are removed by etching. The outermost first conductor layer (258F) is formed using a subtractive method. The outermost second electrolytic plating film (44us), the outermost second seed layer (42us) and the outermost second metal foil (32us) exposed from the etching resist (48us) are removed by etching. The outermost second conductor layer (258S) is formed using a subtractive method (FIG. 7B). The first build-up layer (Bu1) is formed on the first surface (F1) of the core substrate 30, and the second build-up layer (Bu2) is formed on the second surface (S2) of the core substrate 30.

The outermost first conductor layer (258F) includes the outermost first metal foil (32uf), the outermost first seed layer (42uf) on the outermost first metal foil (32uf), and the outermost first electrolytic plating film (44uf) on the outermost first seed layer (42uf). The outermost second conductor layer (258S) includes the outermost second metal foil (32us), the outermost second seed layer (42us) on the outermost second metal foil (32us), and the outermost second electrolytic plating film (44us) on the outermost second seed layer (42us). The outermost first conductor layer (258F) has the outermost first base angles (θufl, θufr), and the outermost second conductor layer (258S) has the outermost second base angles (θusl, θusr). The rough surface of the outermost first resin insulating layer (250F) has the fifth roughness (rz5), and the rough surface of the outermost second resin insulating layer (250S) has the ninth roughness (rz9).

The rough surfaces of the outermost resin insulating layers (250F, 250S) belong to large rough surfaces. The outermost conductor layers (258F, 258S) are each formed by conductor circuits having small base angles. The outermost conductor layers (258F, 258S) belong to conductor layers each having a large thickness.

Figure 1B:
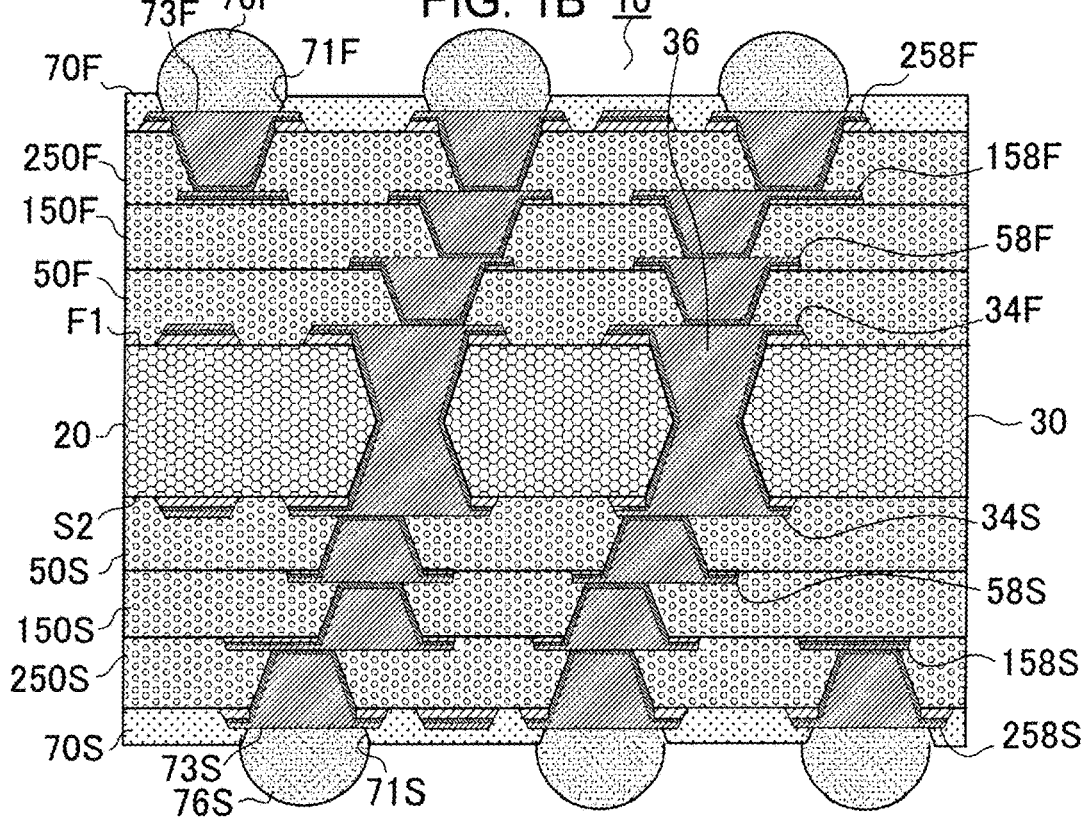

The first solder resist layer (70F) having the first openings (71F) exposing the first pads (73F) included in the outermost first conductor layer (258F) is formed on the first build-up layer (Bu1). The second solder resist layer (70S) having the second openings (71S) exposing the second pads (73S) included in the outermost second conductor layer (258S) is formed on the second build-up layer (Bu2) (FIG. 1A). First solder bumps (76F) are respectively formed by reflow on the first pads (73F) exposed from the first openings (71F). Second solder bumps (76S) are respectively formed by reflow on the second pads (73S) exposed from the second openings (71S). The printed wiring board 10 having the solder bumps is completed (FIG. 1B).

The seed layers are preferably each formed by an electroless copper plating film. The electrolytic plating films are preferably each formed by an electrolytic copper plating film.

A size (ten-point average roughness) (Rz) of a rough surface of a resin insulating layer having a small rough surface is 1.5 μm or more and 2.5 μm or less. A size (ten-point average roughness) (Rz) of a rough surface of a resin insulating layer having a large rough surface is 3.5 μm or more and 5.0 μm or less. The sizes of the rough surfaces of the core layer 20 are 3.5 μm or more and 5.0 μm or less. The sizes of the rough surfaces of the outermost resin insulating layers (250F, 250S) are 3.5 μm or more and 5.0 μm or less. From a point of view of the sizes of the rough surfaces, the rough surfaces are classified into small rough surfaces and large rough surfaces. For example, a size (Rz) of a small rough surface is 2.5 μm or less, and a size (Rz) of a large rough surface is 3.5 μm or more.

A ten-point average roughness (Rz) of an unevenness of a mat surface of a metal foil formed on a resin insulating layer having a small rough surface is 1.5 μm or more and 2.5 μm or less. A ten-point average roughness (Rz) of an unevenness of a mat surface of a metal foil formed on a resin insulating layer having a large rough surface is 3.5 μm or more and 5.0 μm or less. The ten-point average roughnesses (Rz) of the unevennesses of the mat surfaces of the metal foils formed on the core layer are 3.5 μm or more and 5.0 μm or less. The ten-point average roughnesses (Rz) of the unevennesses of the mat surfaces of the metal foils formed on the outermost resin insulating layers are 3.5 μm or more and 5.0 μm or less. The roughnesses of the mat surfaces are classified as large unevennesses and small unevennesses. The conductor layers (34F, 34S) forming the core substrate 30 are each formed from a metal foil having a large unevenness. The outermost conductor layers (258F, 258S) are each formed from a metal foil having a large unevenness. At least one inner side conductor layer is formed from a metal foil having a large unevenness. At least one inner side conductor layer is formed from a metal foil having a small unevenness.

Conductor circuits formed from a metal foil having a large unevenness have small base angles, and conductor circuits formed from a metal foil having a small unevenness have large base angles.

For example, a rough surface of a resin insulating layer is formed by transferring a mat surface of a metal foil laminated on the resin insulating layer. The rough surfaces of the core layer are formed by transferring the mat surfaces of the metal foils laminated on the core layer. A large rough surface is formed from a metal foil having a large unevenness. A small rough surface is formed from a metal foil having a small unevenness. A size of a mat surface and a size of rough surface are substantially equal to each other. A size of a mat surface and a size of rough surface are preferably equal to each other.

For example, large base angles are larger than 80 degrees and less than 90 degrees. Large base angles are preferably larger than 85 degrees. Small base angles are larger than 70 degrees and less than 85 degrees. Small base angles are preferably less than 85 degrees. The conductor layers (34F, 34S) forming the core substrate 30 are each formed by conductor circuits having small base angles. The outermost conductor layers (258F, 258S) are each formed by conductor circuits having small base angles. At least one inner side conductor layer is formed by conductor circuits having small base angles. At least one inner side conductor layer is formed by conductor circuits having large base angles.

A size of a rough surface is related to the base angles of the conductor circuits forming the conductor layer on the rough surface. For example, base angles of conductor circuits formed on a resin insulating layer having a small rough surface are larger than 80 degrees and smaller than 90 degrees. Base angles of conductor circuits formed on a resin insulating layer having a large rough surface are larger than 70 degrees and smaller than 85 degrees.

A thickness of a conductor layer is related to the base angles of the conductor circuits forming the conductor layer. A thickness of a conductor layer formed by conductor circuits having large base angles is small, and a thickness of a conductor layer formed by conductor circuits having small base angles is large. The conductor layers (34F, 34S) forming the core substrate 30 are classified as conductor layers each having a large thickness. The outermost conductor layers (258F, 258S) are classified as conductor layers each having a large thickness. At least one inner side conductor layer is classified as a conductor layer having a large thickness. At least one inner side conductor layer is classified as a conductor layer having a small thickness.

A thickness of a conductor layer having a large thickness is larger than a thickness of a conductor layer having a small thickness. For example, a thickness of a conductor layer having a large thickness is 15 μm or more and 35 μm or less. A thickness of a conductor layer having a large thickness is preferably 20 μm or more. A thickness of a conductor layer having a small thickness is 5 μm or more and 25 μm or less. A thickness of a conductor layer having a small thickness is preferably 15 μm or less. Base angles of conductor circuits each having a small thickness are large, and base angles of conductor circuits each having a large thickness are small. Therefore, a difference in conductor volume between the two is reduced. A difference in data transmission speed is reduced.

A conductor layer having a large thickness is formed on a large rough surface, and a conductor layer having a small thickness is formed on a small rough surface. From a point of view of a skin effect and a conductor volume, a difference in data transmission speed between the two is reduced.

Base angles of conductor circuits forming a conductor layer are related to the thickness of the metal foil forming the conductor layer. A conductor layer formed by conductor circuits having large base angles is formed from a metal foil having a small thickness. A conductor layer formed by conductor circuits having small base angles is formed from a metal foil having a large thickness. The metal foils forming the conductor layers are classified into metal foils each having a large thickness and metal foils each having a small thickness. A thickness of a metal foil having a large thickness is larger than a thickness of a metal foil having a small thickness. A thickness of a metal foil having a large thickness is 2 μm or more and 15 μm or less. A thickness of a metal foil having a large thickness is preferably 5 μm or more. A thickness of a metal foil having a small thickness is 2 μm or more and 5 μm or less. A thickness of a metal foil having a small thickness is preferably 3 μm or less. The conductor layers (34F, 34S) forming the core substrate 30 are each formed from a metal foil having a large thickness. The outermost conductor layers (258F, 258S) are each formed from a metal foil having a large thickness. At least one inner side conductor layer is formed from a metal foil having a large thickness. At least one inner side conductor layer is formed from a metal foil having a small thickness.

A thickness of a metal foil is related to a size of an unevenness of a mat surface of the metal foil. A metal foil having a large thickness is a metal foil having a large unevenness, and a metal foil having a small thickness is a metal foil having a small unevenness.

Examples of the thicknesses of the conductor layers are described below.

The thicknesses of the conductor layers (34F, 34S) forming the core substrate 30 are 15 μm or more and 35 μm or less. The thicknesses of the metal foils forming the conductor layers of the core substrate are 2 μm or more and 15 μm or less. The thicknesses of the electrolytic plating films forming the conductor layers of the core substrate are 1 μm or more and 12 μm or less.

The thicknesses of the outermost conductor layers (258F, 258S) are 15 μm or more and 35 μm or less. The thicknesses of the metal foils forming the outermost conductor layers are 2 μm or more and 15 μm or less. The thicknesses of the electrolytic plating films forming the outermost conductor layers are 1 μm or more and 12 μm or less.

The thicknesses of the inner side conductor layers each having a small thickness are 5 μm or more and 25 μm or less. The thicknesses of the metal foils forming the inner side conductor layers each having a small thickness are 2 μm or more and 5 μm or less. The thicknesses of the electrolytic plating films forming the inner side conductor layers each having a small thickness are 5 μm or more and 25 μm or less.

The thicknesses of the inner side conductor layers each having a large thickness are 15 μm or more and 35 μm or less. The thicknesses of the metal foils forming the inner side conductor layers each having a large thickness are 2 μm or more and 15 μm or less. The thicknesses of the electrolytic plating films forming the inner side conductor layers each having a large thickness are 1 μm or more and 12 μm or less.

The thicknesses of the metal foils forming the outermost conductor layers can be made smaller than the thicknesses of the metal foils forming the conductor layers of the core substrate.

Examples of the roughnesses of the mat surfaces of the metal foils forming the conductor layers are described below.

The ten-point average roughnesses (Rz) of the unevennesses of the mat surfaces of the metal foils forming the outermost conductor layers are 3.0 μm or more and 5.0 μm or less.

The ten-point average roughnesses (Rz) of the unevennesses of the mat surfaces of the metal foils forming the conductor layers of the core substrate are 3.0 μm or more and 5.0 μm or less.

The ten-point average roughnesses of the unevennesses of the mat surfaces of the metal foils forming the outermost conductor layers can be made smaller than the ten-point average roughnesses of the unevennesses of the mat surfaces of the metal foils forming the conductor layers of the core substrate. For example, the roughnesses (Rz) of the unevennesses of the mat surfaces of the metal foils forming the conductor layers of the core substrate are 3.5 μm or more and 5.0 μm or less. The ten-point average roughnesses (Rz) of the unevennesses of the mat surfaces of the metal foils forming the outermost conductor layers are 3.0 μm or more and 4.5 μm or less.

A ten-point average roughness (Rz) of an unevenness of a mat surface of a metal foil forming an inner side conductor layer having a small thickness is 1.5 μm or more and 2.5 μm or less.

A ten-point average roughness (Rz) of an unevenness of a mat surface of a metal foil forming an inner side conductor layer having a large thickness is 3.0 μm or more and 5.0 μm or less.

The thicknesses of the metal foils forming the outermost conductor layers can be made smaller than the thicknesses of the metal foils forming the conductor layers of the core substrate. The ten-point average roughnesses of the unevennesses of the mat surfaces of the metal foils forming the outermost conductor layers can be made smaller than the ten-point average roughnesses of the unevennesses of the mat surfaces of the metal foils forming the conductor layers of the core substrate.

Japanese Patent Laid-Open Publication No. 2012-156525 describes a multilayer printed wiring board in FIG. 2A. In the printed wiring board, insulating layers and conductor layers are alternately laminated, and adjacent conductor layers are connected to each other by via holes formed in the insulating layers. Further, Japanese Patent Laid-Open Publication No. 2012-156525 describes a method for manufacturing the multilayer printed wiring board in FIG. 9A-9E, 10A-10E, 11, and 12A-12B. According to FIG. 9B of Japanese Patent Laid-Open Publication No. 2012-156525, openings for via hole formation reaching a copper foil are formed in an insulating layer. Thereafter, the via holes are respectively formed in the openings. Thereafter, as illustrated in FIG. 9E, conductor layers are formed on both sides of the insulating layer. Then, by alternately laminating insulating layers and conductor layers on both sides of the circuit substrate of FIG. 9E, the multilayer printed wiring board illustrated in FIG. 12A of Japanese Patent Laid-Open Publication No. 2012-156525 is manufactured.

According to the manufacturing method illustrated in FIG. 9A-9E, 10A-10E, 11, and 12A-12B, in Japanese Patent Laid-Open Publication No. 2012-156525, the circuit substrate of FIG. 9E is thought to be a core substrate. Then, the core substrate has the via holes reaching the copper foil. For example, when the multilayer printed wiring board illustrated in FIG. 12A of Japanese Patent Laid-Open Publication No. 2012-156525 is subjected to a stress due to heat cycles, the circuit substrate (core substrate) illustrated in FIG. 9E is thought to be subjected to a large stress. In particular, a stress acting on interfaces between bottom surfaces of the via holes formed in the circuit substrate (core substrate) illustrated in FIG. 9E of Japanese Patent Laid-Open Publication No. 2012-156525 and the copper foil (conductor circuits) in contact with the bottom surfaces is thought to be large. Due to the stress, connection reliability between the bottom surfaces of the via holes in the circuit substrate (core substrate) illustrated in FIG. 9E and the copper foil (conductor circuits) is expected to decrease.

A printed wiring board according to a first aspect of the present invention includes: a core substrate having a core layer having a first surface and a second surface on an opposite side with respect to the first surface, a first conductor layer on the first surface of the core layer, a second conductor layer on the second surface of the core layer, and through-hole conductors penetrating the core layer and connecting the first conductor layer and the second conductor layer to each other; a first resin insulating layer that has a third surface and a fourth surface on an opposite side with respect to the third surface and is formed on the first surface and the first conductor layer such that the first surface and the fourth surface oppose each other; a second resin insulating layer that has a seventh surface and an eighth surface on an opposite side with respect to the seventh surface and is formed on the second surface and the second conductor layer such that the second surface and the eighth surface oppose each other; an inner side first conductor layer formed on the third surface of the first resin insulating layer; an inner side second conductor layer formed on the seventh surface of the second resin insulating layer; an outermost first resin insulating layer that has a fifth surface and a sixth surface on an opposite side with respect to the fifth surface and is formed on the first resin insulating layer and the inner side first conductor layer such that the sixth surface faces toward the first surface; an outermost second resin insulating layer that has a ninth surface and a tenth surface on an opposite side with respect to the ninth surface and is formed on the second resin insulating layer and the inner side second conductor layer such that the tenth surface faces toward the second surface; an outermost first conductor layer formed on the outermost first resin insulating layer; an outermost second conductor layer formed on the outermost second resin insulating layer; a first solder resist layer formed on the outermost first resin insulating layer and the outermost first conductor layer; and a second solder resist layer formed on the outermost second resin insulating layer and the outermost second conductor layer. A cross-sectional shape of each of conductor circuits forming the first conductor layer is substantially a trapezoid, a cross-sectional shape of each of conductor circuits forming the second conductor layer is substantially a trapezoid, a cross-sectional shape of each of conductor circuits forming the inner side first conductor layer is substantially a trapezoid, a cross-sectional shape of each of conductor circuits forming the inner side second conductor layer is substantially a trapezoid, a cross-sectional shape of each of conductor circuits forming the outermost first conductor layer is substantially a trapezoid, and a cross-sectional shape of each of conductor circuits forming the outermost second conductor layer is substantially a trapezoid. The first surface, the second surface, the third surface, the fifth surface, the seventh surface, and the ninth surface each have a rough surface. The rough surface of the first surface has a first ten-point average roughness (rz1). The rough surface of the second surface has a second ten-point average roughness (rz2). The rough surface of the third surface has a third ten-point average roughness (rz3). The rough surface of the fifth surface has a fifth ten-point average roughness (rz5). The rough surface of the seventh surface has a seventh ten-point average roughness (rz7). The rough surface of the ninth surface has a ninth ten-point average roughness (rz9). The rz3 is the smallest among the rz3, the rz1, the rz2, the rz5, and the rz9. The rz7 is the smallest among the rz7, the rz1, the rz2, the rz5, and the rz9. The first conductor layer, the second conductor layer, the inner side first conductor layer, the inner side second conductor layer, the outermost first conductor layer, and the outermost second conductor layer are each formed by a metal foil, a seed layer on the metal foil, and an electrolytic plating film on the seed layer. The first conductor layer is formed by multiple first conductor circuits, and first spaces between adjacent first conductor circuits. The second conductor layer is formed by multiple second conductor circuits, and second spaces between adjacent second conductor circuits. The inner side first conductor layer is formed by multiple inner side first conductor circuits, and inner side first spaces between adjacent inner side first conductor circuits. The inner side second conductor layer is formed by multiple inner side second conductor circuits, and inner side second spaces between adjacent inner side second conductor circuits. The outermost first conductor layer is formed by multiple outermost first conductor circuits, and outermost first spaces between adjacent outermost first conductor circuits. The outermost second conductor layer is formed by multiple outermost second conductor circuits, and outermost second spaces between adjacent outermost second conductor circuits. The first conductor circuits have first conductor circuit widths, the second conductor circuits have second conductor circuit widths, the inner side first conductor circuits have inner side first conductor circuit widths, the inner side second conductor circuits have inner side second conductor circuit widths, the outermost first conductor circuits have outermost first conductor circuit widths, and the outermost second conductor circuits have outermost second conductor circuit widths. The first conductor circuit widths include a minimum first conductor circuit width of a minimum first conductor circuit, the second conductor circuit widths include a minimum second conductor circuit width of a minimum second conductor circuit, the inner side first conductor circuit widths include a minimum inner side first conductor circuit width of a minimum inner side first conductor circuit, the inner side second conductor circuit widths include a minimum inner side second conductor circuit width of a minimum inner side second conductor circuit, the outermost first conductor circuit widths include a minimum outermost first conductor circuit width of a minimum outermost first conductor circuit, and the outermost second conductor circuit widths include a minimum outermost second conductor circuit width of a minimum outermost second conductor circuit. The minimum inner side first conductor circuit width is the smallest among the minimum inner side first conductor circuit width, the minimum first conductor circuit width, the minimum second conductor circuit width, the minimum outermost first conductor circuit width, and the minimum outermost second conductor circuit width. The minimum inner side second conductor circuit width is the smallest among the minimum inner side second conductor circuit width, the minimum first conductor circuit width, the minimum second conductor circuit width, the minimum outermost first conductor circuit width, and the minimum outermost second conductor circuit width. The first spaces have first space widths, the second spaces have second space widths, the inner side first spaces have inner side first space widths, the inner side second spaces have inner side second space widths, the outermost first spaces have outermost first space widths, and the outermost second spaces have outermost second space widths. The first space widths include a minimum first space width, the second space widths include a minimum second space width, the inner side first space widths include a minimum inner side first space width, the inner side second space widths include a minimum inner side second space width, the outermost first space widths include a minimum outermost first space width, and the outermost second space widths include a minimum outermost second space width. The minimum inner side first space width is the smallest among the minimum inner side first space width, the minimum first space width, the minimum second space width, the minimum outermost first space width, and the minimum outermost second space width. The minimum inner side second space width is the smallest among the minimum inner side second space width, the minimum first space width, the minimum second space width, the minimum outermost first space width, and the minimum outermost second space width. The minimum first conductor circuit has first base angles between a bottom surface of the minimum first conductor circuit and side surfaces of the minimum first conductor circuit. The minimum second conductor circuit has second base angles between a bottom surface of the minimum second conductor circuit and side surfaces of the minimum second conductor circuit. The minimum inner side first conductor circuit has inner side first base angles between a bottom surface of the minimum inner side first conductor circuit and side surfaces of the minimum inner side first conductor circuit. The minimum inner side second conductor circuit has inner side second base angles between a bottom surface of the minimum inner side second conductor circuit and side surfaces of the minimum inner side second conductor circuit. The minimum outermost first conductor circuit has outermost first base angles between a bottom surface of the minimum outermost first conductor circuit and side surfaces of the minimum outermost first conductor circuit. The minimum outermost second conductor circuit has outermost second base angles between a bottom surface of the minimum outermost second conductor circuit and side surfaces of the minimum outermost second conductor circuit. The inner side first base angles are the largest among the inner side first base angles, the first base angles, the second base angles, the outermost first base angles, and the outermost second base angles. The inner side second base angles are the largest among the inner side second base angles, the first base angles, the second base angles, the outermost first base angles, and the outermost second base angles.

A printed wiring board according to a second aspect of the present invention includes: a core substrate having a core layer having a first surface and a second surface on an opposite side with respect to the first surface, a first conductor layer on the first surface of the core layer, a second conductor layer on the second surface of the core layer, and through-hole conductors penetrating the core layer and connecting the first conductor layer and the second conductor layer to each other; a first resin insulating layer that has a third surface and a fourth surface on an opposite side with respect to the third surface and is formed on the first surface and the first conductor layer such that the first surface and the fourth surface oppose each other; a second resin insulating layer that has a seventh surface and an eighth surface on an opposite side with respect to the seventh surface and is formed on the second surface and the second conductor layer such that the second surface and the eighth surface oppose each other; an inner side first conductor layer formed on the third surface of the first resin insulating layer; an inner side second conductor layer formed on the seventh surface of the second resin insulating layer; an outermost first resin insulating layer that has a fifth surface and a sixth surface on an opposite side with respect to the fifth surface and is formed on the first resin insulating layer and the inner side first conductor layer such that the sixth surface faces toward the first surface; an outermost second resin insulating layer that has a ninth surface and a tenth surface on an opposite side with respect to the ninth surface and is formed on the second resin insulating layer and the inner side second conductor layer such that the tenth surface faces toward the second surface; an outermost first conductor layer formed on the outermost first resin insulating layer; and an outermost second conductor layer formed on the outermost second resin insulating layer. The first conductor layer includes first conductor circuits, a cross-sectional shape of each of the first conductor circuits is substantially a trapezoid, and each of the first conductor circuits has first base angles between a bottom surface of the each of the first conductor circuits and side surfaces of the each of the first conductor circuits. The second conductor layer includes second conductor circuits, a cross-sectional shape of each of the second conductor circuits is substantially a trapezoid, and each of the second conductor circuits has second base angles between a bottom surface of the each of the second conductor circuits and side surfaces of the each of the second conductor circuits. The inner side first conductor layer includes inner side first conductor circuits, a cross-sectional shape of each of the inner side first conductor circuits is substantially a trapezoid, and each of the inner side first conductor circuits has inner side first base angles between a bottom surface of the each of the inner side first conductor circuits and side surfaces of the each of the inner side first conductor circuits. The inner side second conductor layer includes inner side second conductor circuits, a cross-sectional shape of each of the inner side second conductor circuits is substantially a trapezoid, and each of the inner side second conductor circuits has inner side first base angles between a bottom surface of the each of the inner side second conductor circuits and side surfaces of the each of the inner side second conductor circuits. The outermost first conductor layer includes outermost first conductor circuits, a cross-sectional shape of each of the outermost first conductor circuits is substantially a trapezoid, and each of the outermost first conductor circuits has outermost first base angles between a bottom surface of the each of the outermost first conductor circuits and side surfaces of the each of the outermost first conductor circuits. The outermost second conductor layer includes outermost second conductor circuits, a cross-sectional shape of each of the outermost second conductor circuits is substantially a trapezoid, and each of the outermost second conductor circuits has outermost second base angles between a bottom surface of the each of the outermost second conductor circuits and side surfaces of the each of the outermost second conductor circuits. The first surface, the second surface, the third surface, the fifth surface, the seventh surface, and the ninth surface each have a rough surface. The rough surface of the first surface has a first ten-point average roughness (rz1). The rough surface of the second surface has a second ten-point average roughness (rz2). The rough surface of the third surface has a third ten-point average roughness (rz3). The rough surface of the fifth surface has a fifth ten-point average roughness (rz5).

The rough surface of the seventh surface has a seventh ten-point average roughness (rz7). The rough surface of the ninth surface has a ninth ten-point average roughness (rz9). Sizes of the roughnesses of the rough surfaces are related to sizes of the base angles, when the sizes of the rough surfaces are large, the sizes of the base angles are small, and when the sizes of the rough surfaces are small, the sizes of the base angles are large.

According to an embodiment of the present invention, the minimum inner side first conductor circuit width is smaller than the minimum first conductor circuit width, the minimum second conductor circuit width, the minimum outermost first conductor circuit width, and the minimum outermost second conductor circuit width. Further, the minimum inner side second conductor circuit width is smaller than the minimum first conductor circuit width, the minimum second conductor circuit width, the minimum outermost first conductor circuit width, and the minimum outermost second conductor circuit width. Therefore, conductor circuits for signals can be formed in the inner side first conductor layer and the inner side second conductor layer. In order to transmit high-speed signals, unevennesses of surfaces of the conductor circuits forming the inner side first conductor layer and unevennesses of surfaces of the conductor circuits forming the inner side second conductor layer are preferably small. Therefore, in the embodiment, the roughness (rz3) of the rough surface of the resin insulating layer supporting the inner side first conductor layer and the roughness (rz7) of the rough surface of the resin insulating layer supporting the inner side second conductor layer are smaller than the roughnesses (rz1, rz2) of the rough surfaces of the core layer. Further, the roughness (rz3) of the rough surface of the resin insulating layer supporting the inner side first conductor layer and the roughness (rz7) of the rough surface of the resin insulating layer supporting the inner side second conductor layer are smaller than the roughnesses (rz5, rz9) of the rough surfaces of the outermost resin insulating layers. When the roughnesses of the rough surfaces are small, the conductor circuits are likely to peel off from the resin insulating layers. In order to suppress occurrence of such a defect, in the embodiment, the inner side first base angles are larger than the first base angles, the second base angles, the outermost first base angles, and the outermost second base angles. Further, the inner side second base angles are larger than the first base angles, the second base angles, the outermost first base angles, and the outermost second base angles. For example, when a cross-sectional area of a minimum conductor circuit formed in the inner side first conductor layer and a cross-sectional area of a minimum conductor circuit formed in the first conductor layer are compared to each other, the cross-sectional area of the minimum conductor circuit formed in the inner side first conductor layer is larger than the cross-sectional area of the minimum conductor circuit formed in the first conductor layer. When a cross-sectional area of a minimum conductor circuit formed in the inner side second conductor layer and a cross-sectional area of a minimum conductor circuit formed in the second conductor layer are compared to each other, the cross-sectional area of the minimum conductor circuit formed in the inner side second conductor layer is larger than the cross-sectional area of the minimum conductor circuit formed in the second conductor layer. In this way, in the printed wiring board of the embodiment, cross-sectional areas of conductor circuits forming the inner side first conductor layer and cross-sectional areas of conductor circuits forming the inner side second conductor layer are relatively large. Since physical properties (for example, a thermal expansion coefficient) of the conductor layers and physical properties (for example, a thermal expansion coefficient) of the resin insulating layers are different from each other, a stress is thought to be accumulated in the conductor circuits due to a heat shock and the like. When a stress per unit area of conductor circuits (the former) having large cross-sectional areas and a stress per unit area of conductor circuits (the latter) having small cross-sectional areas are compared to each other, the stress per unit area of the former is larger than the stress per unit area of the latter. And, the stress is released in a form of heat or the like. Due to the release of the stress, it is expected that the stress is transmitted to interfaces between the conductor circuits and the rough surfaces of the resin insulating layers. When the stress per unit area is large and the sizes of the rough surfaces are small, the conductor circuits are likely to peel off from the resin insulating layers. However, in the embodiment, the stress per unit area is small and the sizes of the rough surfaces are small. Further, with respect to the inner side first conductor layer and the inner side second conductor layer, the first conductor circuits forming the first conductor layer have relatively small cross-sectional areas. However, the first conductor circuits included in the first conductor layer are bonded to a resin insulating layer via a relatively large rough surface. Therefore, even when the stress per unit area is large, since the size of the rough surface is large, the first conductor layer is unlikely to peel off from the resin insulating layer. Similar to the first conductor layer, the second conductor layer, the outermost first conductor layer, and the outermost second conductor layer are unlikely to peel off from the resin insulating layers.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
    a core substrate having a core layer, a first conductor layer on a first surface of the core layer, a second conductor layer on a second surface of the core layer on an opposite side with respect to the first surface, and a plurality of through-hole conductors penetrating through the core layer and connecting the first conductor layer and the second conductor layer;
    a first build-up layer formed on a first surface side of the core substrate and comprising a first resin insulating layer, an inner side first conductor layer formed on the first resin insulating layer, an outermost first resin insulating layer formed on the inner side first conductor layer, an outermost first conductor layer formed on the outermost first resin insulating layer, and a first solder resist layer formed on the outermost first conductor layer; and
    a second build-up layer formed on a second surface side of the core substrate on an opposite side with respect to the first surface side of the core substrate and comprising a second resin insulating layer, an inner side second conductor layer formed on the second resin insulating layer, an outermost second resin insulating layer formed on the inner side second conductor layer, an outermost second conductor layer formed on the outermost second resin insulating layer, and a second solder resist layer formed on the outermost second conductor layer,
    wherein each of the first and second conductor layers, inner side first and second conductor layers and outermost first and second conductor layers includes a plurality of conductor circuits having substantially a trapezoid cross-sectional shape, and a plurality of spaces between adjacent conductor circuits, each of the first and second conductor layers, inner side first and second conductor layers and outermost first and second conductor layers comprises a metal foil, a seed layer formed on the metal foil, and an electrolytic plating film formed on the seed layer, the inner side first conductor layer has a smallest minimum circuit width, a smallest minimum space width and a largest base angle among the inner side first conductor layer, first and second conductor layers and outermost first and second conductor layers, the inner side second conductor layer has a smallest minimum circuit width, a smallest minimum space width and a largest base angle among the inner side second conductor layer, first and second conductor layers and outermost first and second conductor layers, and the core layer, first and second resin insulating layers and outermost first and second resin insulating layers are formed such that rz3 is a smallest among rz3, rz1, rz2, rz5 and rz9 and that rz7 is a smallest among rz7, rz1, rz2, rz5, and rz9, where rz1 is a ten-point average roughness of the first surface of the core layer, rz2 is a ten-point average roughness of the second surface of the core layer, rz3 is a ten-point average roughness of a surface of the first resin insulating layer facing the inner side first conductor layer, rz5 is a ten-point average roughness of a surface of the second resin insulating layer facing the inner side second conductor layer, rz7 is a ten-point average roughness of a surface of the outermost first resin insulating layer facing the outermost first conductor layer, and rz9 is a ten-point average roughness of a surface of the outermost second resin insulating layer facing the outermost second conductor layer.

2. The printed wiring board according to claim 1, wherein when a size of the base angle is different between one on a right side and one on a left side, the base angle is represented by a larger base angle between the one on a right side and the one on a left side for the first and second conductor layers, inner side first and second conductor layers and outermost first and second conductor layers.

3. The printed wiring board according to claim 1, wherein the core substrate has a plurality of through holes in which the plurality of through-hole conductors is formed respectively, and each of the through holes has a first opening tapered from the first surface toward the second surface of the core layer, and a second opening tapered from the second surface toward the first surface of the core layer.

4. The printed wiring board according to claim 2, wherein the core substrate has a plurality of through holes in which the plurality of through-hole conductors is formed respectively, and each of the through holes has a first opening tapered from the first surface toward the second surface of the core layer, and a second opening tapered from the second surface toward the first surface of the core layer.

5. A printed wiring board, comprising:
a core substrate having a core layer, a first conductor layer on a first surface of the core layer, a second conductor layer on a second surface of the core layer on an opposite side with respect to the first surface, and a plurality of through-hole conductors penetrating through the core layer and connecting the first conductor layer and the second conductor layer;
a first build-up layer formed on a first surface side of the core substrate and comprising a first resin insulating layer, an inner side first conductor layer formed on the first resin insulating layer, an outermost first resin insulating layer formed on the inner side first conductor layer, and an outermost first conductor layer formed on the outermost first resin insulating layer; and
a second build-up layer formed on a second surface side of the core substrate on an opposite side with respect to the first surface side of the core substrate and comprising a second resin insulating layer, an inner side second conductor layer formed on the second resin insulating layer, an outermost second resin insulating layer formed on the inner side second conductor layer, and an outermost second conductor layer formed on the outermost second resin insulating layer,
wherein each of the first and second conductor layers, inner side first and second conductor layers and outermost first and second conductor layers includes a plurality of conductor circuits having substantially a trapezoid cross-sectional shape and a base angle, the core layer, first and second resin insulating layers and outermost first and second resin insulating layers are formed such that the first surface of the core layer has a ten-point average roughness rz1, the second surface of the core layer has a ten-point average roughness rz2, a surface of the first resin insulating layer facing the inner side first conductor layer has a ten-point average roughness rz3, a surface of the second resin insulating layer facing the inner side second conductor layer has a ten-point average roughness rz5, a surface of the outermost first resin insulating layer facing the outermost first conductor layer has a ten-point average roughness rz7, and a surface of the outermost second resin insulating layer facing the outermost second conductor layer has a ten-point average roughness rz9, and the first and second conductor layers, inner side first and second conductor layers and outermost first and second conductor layers are formed such that when a resin insulating layer has a larger ten-point average roughness, a base angle of the trapezoid cross-sectional shape on the resin insulating layer is formed smaller, and that when a resin insulating layer has a smaller ten-point average roughness, a base angle of the trapezoid cross-sectional shape is formed larger.

6. The printed wiring board according to claim 5, wherein the first and second build-up layers are formed such that resin insulating layers having smaller surfaces are symmetrically formed with respect to the core substrate.

7. The printed wiring board according to claim 5, wherein each of the first and second conductor layers, inner side first and second conductor layers and outermost first and second conductor layers comprises a metal foil, a seed layer formed on the metal foil, and an electrolytic plating film formed on the seed layer.

8. The printed wiring board according to claim 6, wherein each of the first and second conductor layers, inner side first and second conductor layers and outermost first and second conductor layers comprises a metal foil, a seed layer formed on the metal foil, and an electrolytic plating film formed on the seed layer.

9. The printed wiring board according to claim 5, wherein each of the first and second conductor layers, inner side first and second conductor layers and outermost first and second conductor layers includes the plurality of conductor circuits having a plurality of spaces between adjacent conductor circuits, and the inner side first conductor layer has a smallest minimum circuit width, a smallest minimum space width and a largest base angle among the inner side first conductor layer, first and second conductor layers and outermost first and second conductor layers, the inner side second conductor layer has a smallest minimum circuit width, a smallest minimum space width and a largest base angle among the inner side second conductor layer, first and second conductor layers and outermost first and second conductor layers.

10. The printed wiring board according to claim 6, wherein each of the first and second conductor layers, inner side first and second conductor layers and outermost first and second conductor layers includes the plurality of conductor circuits having a plurality of spaces between adjacent conductor circuits, and the inner side first conductor layer has a smallest minimum circuit width, a smallest minimum space width and a largest base angle among the inner side first conductor layer, first and second conductor layers and outermost first and second conductor layers, the inner side second conductor layer has a smallest minimum circuit width, a smallest minimum space width and a largest base angle among the inner side second conductor layer, first and second conductor layers and outermost first and second conductor layers.

11. The printed wiring board according to claim 7, wherein each of the first and second conductor layers, inner side first and second conductor layers and outermost first and second conductor layers includes the plurality of conductor circuits having a plurality of spaces between adjacent conductor circuits, and the inner side first conductor layer has a smallest minimum circuit width, a smallest minimum space width and a largest base angle among the inner side first conductor layer, first and second conductor layers and outermost first and second conductor layers, the inner side second conductor layer has a smallest minimum circuit width, a smallest minimum space width and a largest base angle among the inner side second conductor layer, first and second conductor layers and outermost first and second conductor layers.

12. The printed wiring board according to claim 5, wherein the core layer, first and second resin insulating layers and outermost first and second resin insulating layers are formed such that rz3 is a smallest among rz3, rz1, rz2, rz5 and rz9 and that rz7 is a smallest among rz7, rz1, rz2, rz5, and rz9.

13. The printed wiring board according to claim 6, wherein the core layer, first and second resin insulating layers and outermost first and second resin insulating layers are formed such that rz3 is a smallest among rz3, rz1, rz2, rz5 and rz9 and that rz7 is a smallest among rz7, rz1, rz2, rz5, and rz9.

14. The printed wiring board according to claim 7, wherein the core layer, first and second resin insulating layers and outermost first and second resin insulating layers are formed such that rz3 is a smallest among rz3, rz1, rz2, rz5 and rz9 and that rz7 is a smallest among rz7, rz1, rz2, rz5, and rz9.

15. The printed wiring board according to claim 9, wherein the core layer, first and second resin insulating layers and outermost first and second resin insulating layers are formed such that rz3 is a smallest among rz3, rz1, rz2, rz5 and rz9 and that rz7 is a smallest among rz7, rz1, rz2, rz5, and rz9.

16. The printed wiring board according to claim 10, wherein the core layer, first and second resin insulating layers and outermost first and second resin insulating layers are formed such that rz3 is a smallest among rz3, rz1, rz2, rz5 and rz9 and that rz7 is a smallest among rz7, rz1, rz2, rz5, and rz9.

17. The printed wiring board according to claim 11, wherein the core layer, first and second resin insulating layers and outermost first and second resin insulating layers are formed such that rz3 is a smallest among rz3, rz1, rz2, rz5 and rz9 and that rz7 is a smallest among rz7, rz1, rz2, rz5, and rz9.

18. The printed wiring board according to claim 5, wherein the inner side first conductor layer has a smallest minimum circuit width and a largest base angle among the inner side first conductor layer, first and second conductor layers and outermost first and second conductor layers, the inner side second conductor layer has a smallest minimum circuit width and a largest base angle among the inner side second conductor layer, first and second conductor layers and outermost first and second conductor layers.

19. The printed wiring board according to claim 6, wherein the inner side first conductor layer has a smallest minimum circuit width and a largest base angle among the inner side first conductor layer, first and second conductor layers and outermost first and second conductor layers, the inner side second conductor layer has a smallest minimum circuit width and a largest base angle among the inner side second conductor layer, first and second conductor layers and outermost first and second conductor layers.

20. The printed wiring board according to claim 7, wherein the inner side first conductor layer has a smallest minimum circuit width and a largest base angle among the inner side first conductor layer, first and second conductor layers and outermost first and second conductor layers, the inner side second conductor layer has a smallest minimum circuit width and a largest base angle among the inner side second conductor layer, first and second conductor layers and outermost first and second conductor layers.

* * * * *